US012428585B2

(12) United States Patent
Ishii et al.

(10) Patent No.: US 12,428,585 B2
(45) Date of Patent: Sep. 30, 2025

(54) COATED SUPER-ABRASIVE GRAINS, ABRASIVE GRAINS, AND WHEEL

(71) Applicants: SUMITOMO ELECTRIC INDUSTRIES, LTD., Osaka (JP); A.L.M.T. Corp., Tokyo (JP)

(72) Inventors: Akito Ishii, Osaka (JP); Katsumi Okamura, Osaka (JP); Masahiro Ohata, Osaka (JP); Masato Michiuchi, Osaka (JP); Kei Hirai, Osaka (JP); Nobuhide Nakamura, Hyogo (JP); Kentaro Chihara, Hyogo (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 912 days.

(21) Appl. No.: 17/632,753

(22) PCT Filed: Aug. 4, 2020

(86) PCT No.: PCT/JP2020/029807
§ 371 (c)(1),
(2) Date: Feb. 3, 2022

(87) PCT Pub. No.: WO2021/025015
PCT Pub. Date: Feb. 11, 2021

(65) Prior Publication Data
US 2022/0290021 A1 Sep. 15, 2022

(30) Foreign Application Priority Data
Aug. 6, 2019 (JP) ................................. 2019-144242

(51) Int. Cl.
*C09K 3/14* (2006.01)
*B24D 3/04* (2006.01)
*B24D 5/02* (2006.01)
*C01B 21/064* (2006.01)

(52) U.S. Cl.
CPC .............. *C09K 3/1436* (2013.01); *B24D 3/04* (2013.01); *B24D 5/02* (2013.01); *C01B 21/064* (2013.01); *C09K 3/1409* (2013.01); *C01P 2002/60* (2013.01); *C01P 2004/80* (2013.01)

(58) Field of Classification Search
CPC ...... C09K 3/1436; C09K 3/1409; B24D 3/04; B24D 5/02; C01B 21/064; C01P 2002/60; C01P 2004/80
See application file for complete search history.

(56) References Cited

U.S. PATENT DOCUMENTS

| | | | |
|---|---|---|---|
| 4,931,068 A | 6/1990 | Dismukes et al. | |
| 5,104,422 A | 4/1992 | St. Pierre | |
| 6,371,842 B1 * | 4/2002 | Romero | B24D 11/001 |
| | | | 451/540 |
| 7,094,447 B2 * | 8/2006 | Ruppi | C23C 16/0272 |
| | | | 427/419.7 |
| 2007/0032369 A1 * | 2/2007 | Franzen | C22C 26/00 |
| | | | 264/669 |
| 2014/0357171 A1 | 12/2014 | Soma | |
| 2015/0003926 A1 * | 1/2015 | Yano | C04B 37/026 |
| | | | 407/119 |
| 2015/0291478 A1 * | 10/2015 | Sorai | C04B 35/645 |
| | | | 501/153 |

FOREIGN PATENT DOCUMENTS

| | | |
|---|---|---|
| EP | 1584670 A1 | 10/2005 |
| JP | S58-191779 A | 11/1983 |
| JP | S61-168569 A | 7/1986 |
| JP | 62-176769 A | 8/1987 |
| JP | H04-331076 A | 11/1992 |
| JP | H07-108461 A | 4/1995 |
| JP | H09-31442 A | 2/1997 |
| JP | 2000-158347 A | 6/2000 |
| JP | 2002-137168 A | 5/2002 |
| JP | 2002-543993 A | 12/2002 |
| JP | 2005-262355 A | 9/2005 |
| JP | 2009-503144 A | 1/2009 |
| JP | 2013-154440 A | 8/2013 |
| JP | 2014-40589 A | 3/2014 |
| WO | 00/68454 A1 | 11/2000 |
| WO | WO 00/68454 * 11/2000 | ........... C04B 41/009 |

(Continued)

OTHER PUBLICATIONS

L. M. Gameza et al., "Investigation of sulphur additions on kinetic processes of cubic boron nitride crystallization in the Li—B—N—H system", Diamond and Related materials, Jan. 1998, vol. 7, No. 1, pp. 32-34.

Bezhenar, M. P. et al., "Physico-Mechanical Properties of cBN Composites Produced by a High-Pressure Reaction Sintering of Cubic Boron Nitride and Aluminum Powders", Journal of Superhard Materials, vol. 32, No. 1, 2010, pp. 1-13.

Luo Xiao-Tao et al., "Thermal Stability of Microstructure and Hardness of Cold-Sprayed cBN/NiCrAl Nanocomposite Coating", Journal of Thermal Spray Technology, vol. 21(3-4) Jun. 2012, pp. 578-585.

*Primary Examiner* — Pegah Parvini
(74) *Attorney, Agent, or Firm* — Renner, Otto, Boisselle & Sklar, LLP

(57) ABSTRACT

A coated super-abrasive grain comprises: a body composed of cubic boron nitride; and a coating film coating at least a portion of a surface of the body, the body having a dislocation density of $9 \times 10^{14}/m^2$ or less, the coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron.

20 Claims, 3 Drawing Sheets

(56) References Cited

FOREIGN PATENT DOCUMENTS

| WO | 2004/061040 A1 | 7/2004 |
| WO | 2006/032982 A1 | 3/2006 |
| WO | 2007/015821 A1 | 2/2007 |
| WO | 2009/117512 A2 | 9/2009 |

* cited by examiner

COATED SUPER-ABRASIVE GRAINS, ABRASIVE GRAINS, AND WHEEL

TECHNICAL FIELD

The present disclosure relates to coated super-abrasive grains, abrasive grains, and a wheel. The present application claims priority based on Japanese Patent Application No. 2019-144242 filed on Aug. 6, 2019. The entire contents of the description in this Japanese patent application are incorporated herein by reference.

BACKGROUND ART

A super-abrasive tool (a wheel) of PTL 1 (Japanese Patent Laid-Open No. 2002-137168) is known as a tool used for precision processing. This super-abrasive tool comprises a disk-shaped substrate and an abrasive grain layer formed on an outer peripheral portion of the substrate. The abrasive grain layer includes super-abrasive grains (mainly cubic boron nitride abrasive grains) and a bonding material which bonds the super-abrasive grains together and also fixes the super-abrasive grains to the outer peripheral portion of the substrate.

CITATION LIST

Patent Literature

[PTL 1] Japanese Patent Laying-Open No. 2002-137168

SUMMARY OF INVENTION

According to the present disclosure, a coated super-abrasive grain comprises:
a body composed of cubic boron nitride; and
a coating film coating at least a portion of a surface of the body,
the body having a dislocation density of $9\times10^{14}/m^2$ or less,
the coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron.

According to the present disclosure, an abrasive grain is composed of cubic boron nitride and has a dislocation density of $9\times10^{14}/m^2$ or less.

According to the present disclosure, a grinding wheel comprises:
a disk-shaped substrate; and
a super-abrasive grain layer covering at least an outer peripheral surface of the substrate,
the super-abrasive layer having one or both of the above coated super-abrasive grain and the above abrasive grain.

DETAILED DESCRIPTION

Figure 1:
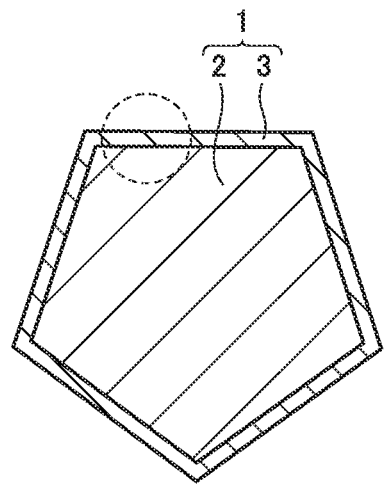
FIG. 1 is a schematic cross section of a coated super-abrasive grain according to a first embodiment.

Problem to be Solved by the Present Disclosure

The super-abrasive grains included in the abrasive grain layer of PTL 1 are per se bare abrasive grains (i.e., their bodies are bare). A portion of the abrasive grain layer that comes into contact with a workpiece while grinding it is locally exposed to high temperature. Thus, when the tool of PTL 1 is used to grind a workpiece, the cubic boron nitride abrasive grains react with a component of the workpiece (mainly an iron group element), and the workpiece tends to adhere to the abrasive grain layer and the abrasive grain layer tends to be increasingly, chemically worn, resulting in the tool providing a reduced grinding ratio.

Accordingly, an object of the present disclosure is to provide coated super-abrasive grains that can be used for a tool to allow the tool to have a high grinding ratio, abrasive grains, and a wheel having a high grinding ratio.

Advantageous Effect of the Present Disclosure

Accordingly to the present disclosure there can be provided coated super-abrasive grains that can be used for a tool to allow the tool to have a high grinding ratio, abrasive grains, and a wheel having a high grinding ratio.

DESCRIPTION OF EMBODIMENTS OF THE PRESENT DISCLOSURE

First, embodiments of the present disclosure will be specified and described.

(1) A coated super-abrasive grain in one embodiment of the present disclosure comprises:
a body composed of cubic boron nitride; and
a coating film coating at least a portion of a surface of the body,
the body having a dislocation density of $9\times10^{14}/m^2$ or less,
the coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron.

A tool using coated super-abrasive grains of the present disclosure can have a high grinding ratio. In the present specification, a grinding ratio is defined as "the volume of a workpiece ground away/the total worn volume of super-abrasive grains."

(2) Preferably, the body of the abrasive grain has a single-crystal structure. This facilitates enhancing the body of the abrasive grain in strength.

(3) Preferably, the body of the abrasive grain has a polycrystalline structure. This helps a tool using such super-abrasive grains to have a better grinding ratio.

(4) Preferably, the body of the abrasive grain has a dislocation density of $2\times10^{14}/m^2$ or less. The lower dislocation density enhances the body of the abrasive grain in toughness. Further, it also enhances adhesiveness of an interface between the coating film and the body of the abrasive grain and suppresses peeling of the film.

(5) Preferably, the body of the abrasive grain has a dislocation density of $5 \times 10^{13}/m^2$ or less. The further lower dislocation density further enhances the body of the abrasive grain in toughness. Further, it also further enhances adhesiveness of an interface between the coating film and the body of the abrasive grain and further suppresses peeling of the film.

(6) Preferably, the coating film includes aluminum and oxygen. When the coating film includes aluminum and oxygen, it is improved in stability against heat and enhanced in wear resistance. As a result, damages such as wear and destruction of the coating film and the body of the abrasive grain are suppressed.

(7) Preferably, the coating film includes $\gamma$-$Al_2O_3$. This allows the coating film to be composed of a plurality of crystal grains having a reduced average grain size, and thus allows the coating film to be enhanced in strength and also enhances adhesive strength between the coating film and the body of the abrasive grain. This in turn suppresses destruction and peeling of the film due to impact caused as the film comes into contact with a workpiece. Therefore, the coating film can maintain satisfactory wear resistance for a long period of time.

(8) Preferably, the coating film includes a plurality of crystal grains, and
the plurality of crystal grains have an average grain size of 500 nm or less. This further enhances the coating film in strength.

(9) Preferably, in the coating film, aluminum and oxygen have an atomic ratio Al/O of 0.2 or more and 0.9 or less.
This further enhances the coating film in wear resistance and also enhances adhesive strength between the coating film and the body of the abrasive grain.

(10) Preferably the Al/O ratio is 0.4 or more and 0.7 or less. This further enhances the coating film in wear resistance and also further enhances adhesive strength between the coating film and the body of the abrasive grain.

(11) Preferably the coating film has a thickness of 50 nm or more and 1000 nm or less. When the coating film has a thickness of 50 nm or more, it facilitates enhancing the coating film per se in wear resistance and hence suppressing damage to the coating film and the body of the abrasive grain. When the coating film has a thickness of 1000 nm or less, the coating film does not have an excessively large thickness and thus does not easily peel off, and a state with the coating film formed on an external surface of the body of the abrasive grain is easily maintained.

(12) Preferably, the coating film has a multilayer structure composed of two or more types of unit layers. When the coating film has a multilayer structure, each unit layer's residual stress increases. This enhances the coating film in hardness and thus suppresses damage to the coating film.

(13) Preferably, the coated super-abrasive grain has a grain size of 30 μm or more and 600 μm or less.

The coated super-abrasive grain having a grain size of 30 μm or more is not excessively small and is thus easily fixed to a substrate and hence facilitates grinding a workpiece, and in addition, it is also easily handled and hence facilitates constructing the wheel. The coated super-abrasive grain having a grain size of 600 μm or less is not excessively large and thus not easily fractured or similarly damaged due to an impactive force acting on the body of the abrasive grain as it is brought into contact with a workpiece.

(14) An abrasive grain in one embodiment of the present disclosure is composed of cubic boron nitride and has a dislocation density of $9 \times 10^{14}/m^2$ or less.

The abrasive grain of the present disclosure is high in toughness, and a tool using such abrasive grains can have a high grinding ratio.

(15) Preferably, the abrasive grain has a single-crystal structure. This facilitates enhancing the abrasive grain in strength.

(16) Preferably, the abrasive grain has a polycrystalline structure. This helps a tool using such abrasive grains to have a better grinding ratio.

(17) Preferably, the dislocation density is $6.5 \times 10^{14}/m^2$ or less. The lower dislocation density enhances the abrasive grain in toughness.

(18) Preferably, the dislocation density is $2 \times 10^{14}/m^2$ or less. The lower dislocation density enhances the abrasive grain in toughness.

(19) Preferably, the dislocation density is $5 \times 10^{13}/m^2$ or less. The further lower dislocation density further enhances the body of the abrasive grain in toughness.

(20) Preferably, the abrasive grain is composed of crystallites having a size of 250 nm or more. This helps a tool using such abrasive grains to have a better grinding ratio.

(21) Preferably, the crystallite has a size of 450 nm or more. This helps a tool using such abrasive grains to have a better grinding ratio.

(22) Preferably, the crystallite has a size of 600 nm or more. This helps a tool using such abrasive grains to have a better grinding ratio.

(23) Preferably, the abrasive grain has a grain size of 30 μm or more and 600 μm or less. The abrasive grain having a grain size of 30 μm or more is not excessively small and thus facilitates grinding a workpiece and in addition, it is also easily handled and hence facilitates constructing a wheel. The abrasive grain having a grain size of 600 μm or less is not excessively large and thus not easily fractured or similarly damaged due to an impactive force acting on the body of the abrasive grain as it is brought into contact with a workpiece.

(24) A wheel in one embodiment of the present disclosure comprises:
a disk-shaped substrate; and
a super-abrasive grain layer covering at least an outer peripheral surface of the substrate,
the super-abrasive layer having one or both of the above coated super-abrasive grain and the above abrasive grain. The wheel of the present disclosure can have a high grinding ratio.

DETAILED DESCRIPTION OF EMBODIMENTS OF THE PRESENT DISCLOSURE

Details of embodiments of the present disclosure will be described below with reference to the drawings. In the drawings of the present disclosure, the same reference numerals designate identical or corresponding parts. In addition, dimensional relations in length, width, thickness, depth, and the like are changed as appropriate for clarity and simplicity of the drawings, and do not necessarily represent actual dimensional relations.

In the present specification, an expression in the form of "A to B" means a range's upper and lower limits (that is, A or more and B or less), and when A is not accompanied by any unit and B is alone accompanied by a unit, A has the same unit as B.

In the present specification, when a compound or the like is represented by a chemical formula without specifying any specific atomic ratio, it shall include any conventionally known atomic ratio and should not necessarily be limited to what falls within a stoichiometric range. For example, for "TiAlN," the ratio of the number of atoms constituting TiAlN includes any conventionally known atomic ratio. This also applies to descriptions for compounds other than "TiAlN."

First Embodiment: Coated Super-Abrasive Grain

Figure 2:
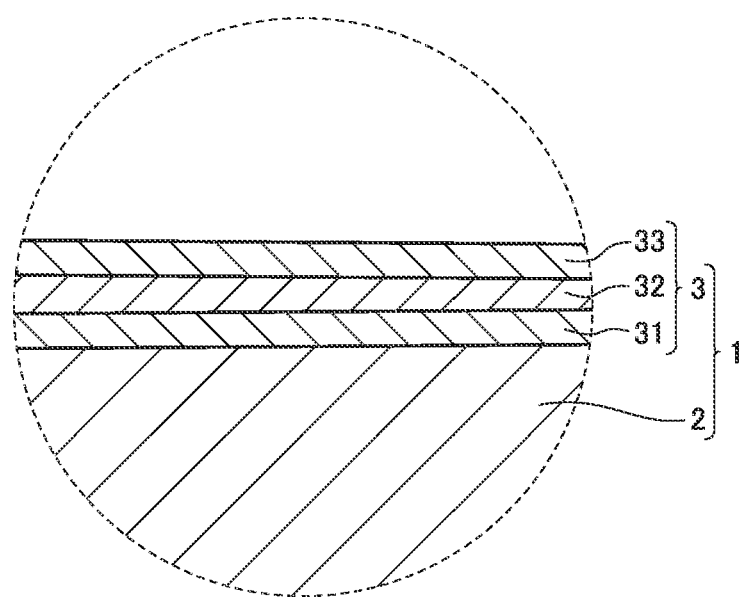
FIG. 2 is an enlarged cross section of a portion of the coated super-abrasive grain shown in FIG. 1 that is surrounded by a circle drawn with a broken line.

A coated super-abrasive grain according to an embodiment of the present disclosure will now be described with reference to FIGS. 1 and 2. FIG. 1 is a schematic cross section of a coated super-abrasive grain according to a first embodiment. FIG. 2 is an enlarged cross section of a portion of the coated super-abrasive grain shown in FIG. 1 that is surrounded by a circle drawn with a broken line.

According to the present disclosure, a coated super-abrasive grain 1 comprises: a body 2 of the abrasive grain composed of cubic boron nitride; and a coating film including aluminum and one or both of oxygen and nitrogen, and coating at least a portion of a surface of body 2 of the abrasive grain, body 2 having a dislocation density of $9 \times 10^{14}/m^2$ or less, the coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron. A tool using coated super-abrasive grains of the present disclosure can have a high grinding ratio. A reason for this is inferred as indicated by items (i) to (iv) below:

(i) The coated super-abrasive grain of the present disclosure has its body composed of cubic boron nitride. Cubic boron nitride is high in hardness. Therefore, the coated super-abrasive grain using cubic boron nitride as its body exhibits excellent wear resistance. A tool using coated super-abrasive grains of the present disclosure can thus have a high grinding ratio.

(ii) The coated super-abrasive grain of the present disclosure has its body with a surface at least partially coated with a coating film. The coated super-abrasive grain thus having the coating film can suppress a chemical reaction caused by the body of the abrasive grain and a component of a workpiece while the workpiece is ground. Further, it can prevent atoms constituting the body of the abrasive grain from diffusing into the coating film and the workpiece. This can suppress progression of wear of the body of the abrasive grain and adhesion of the component of the workpiece, and accordingly, grinding force is low and stable for a long period of time. As a result, fracture of the body of the abrasive grain due to adhesion and peeling, increased grinding force, and the like is also reduced. A tool using coated super-abrasive grains of the present disclosure can thus have a high grinding ratio.

(iii) The coated super-abrasive grain of the present disclosure comprises one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron. This enhances the coating film in stability against heat and enhances wear resistance in grinding a workpiece. As a result, damages such as wear and destruction of the coating film and the body of the abrasive grain are suppressed. A tool using coated super-abrasive grains of the present disclosure can thus have a high grinding ratio.

(iv) The coated super-abrasive grain of the present disclosure has a body with a dislocation density of $9 \times 10^{14}/m^2$ or less. When the abrasive grain has a body with a dislocation density of $9 \times 10^{14}/m^2$ or less, it allows the abrasive grain to have a body excellent in toughness. In addition, there are few lattice defects in the body of the abrasive grain, which can reduce defects caused while grinding. Further, it also reduces lattice defects at an interface between the body of the abrasive grain and the coating film that are attributed to lattice defects of the body of the abrasive grain, and thus enhances adhesive strength between the coating film and the body of the abrasive grain and suppresses peeling of the film. As a result, damages such as wear and destruction of the coating film and the body of the abrasive grain are suppressed. A tool using coated super-abrasive grains of the present disclosure can thus have a high grinding ratio.

(Grain Size of Coated Super-Abrasive Grain)

The coated super-abrasive grain preferably has a grain size of 30 μm or more and 600 μm or less. For the coated super-abrasive grain of the first embodiment, the grain size of the coated super-abrasive grain means the grain size of a single coated super-abrasive grain.

The coated super-abrasive grain having a grain size of 30 μm or more is not excessively small and is thus easily fixed to a wheel and hence facilitates grinding a workpiece, and in addition, it is also easily handled and hence facilitates constructing the wheel. The coated super-abrasive grain having a grain size of 600 μm or less is not excessively large and thus not easily fractured or similarly damaged due to an impactive force acting on the body of the abrasive grain as it is brought into contact with a workpiece.

The coated super-abrasive grain has a grain size with a lower limit preferably of 30 μm or more, more preferably 50 μm or more, still more preferably 60 μm or more. The coated super-abrasive grain has the grain size with an upper limit preferably of 600 μm or less, more preferably 300 μm or less, still more preferably 150 μm or less. The coated super-abrasive grain preferably has a grain size of 50 μm or more and 300 μm or less, more preferably 60 μm or more and 150 μm or less.

The grain size of the coated super-abrasive grain is measured with a laser diffraction type particle size distribution analyzer (the SALD series manufactured by Shimadzu Corporation).

[Body of Abrasive Grain]

(Composition)

The body of the abrasive grain is composed of cubic boron nitride (hereinafter also referred to as "cBN"). Cubic boron nitride is high in hardness. Therefore, the coated super-abrasive grain using cubic boron nitride as its body exhibits excellent wear resistance. A tool using coated super-abrasive grains of the present disclosure can thus have a high grinding ratio. The body of the abrasive grain can include inevitable impurities insofar as it can present an effect of the present disclosure. Examples of the inevitable impurities include carbon (C), aluminum (Al), silicon (Si), lithium (Li), calcium (Ca), and magnesium (Mg). The body of the abrasive grain contains the inevitable impurities in an amount, for example, by mass, of 0.001% or more and 0.5% or less.

The composition of the body of the abrasive grain can be identified using an energy dispersive X-ray (EDX) analyzer (Octane Elect EDS system) (trademark) accompanying a scanning electron microscope (SEM) ("JSM-7800F" (trademark) manufactured by JEOL Ltd.).
(Dislocation Density)

The body of the abrasive grain has a dislocation density of $9\times10^{14}/m^2$ or less. When the abrasive grain has a body with a dislocation density of $9\times10^{14}/m^2$ or less, it allows the abrasive grain to have a body excellent in toughness. In addition, there are few lattice defects in the body of the abrasive grain, which can reduce defects caused while grinding. Further, it also reduces lattice defects at an interface between the body of the abrasive grain and the coating film that are attributed to lattice defects of the body of the abrasive grain, and thus enhances adhesive strength between the coating film and the body of the abrasive grain and suppresses peeling of the film. As a result, damages such as wear and destruction of the coating film and the body of the abrasive grain are suppressed. A tool using coated superabrasive grains of the present disclosure can thus have a high grinding ratio.

The body of the abrasive grain has a dislocation density with a lower limit preferably of $1\times10^{8}/m^2$ or more, more preferably $1\times10^{10}/m^2$ or more, more preferably $5\times10^{10}/m^2$ or more. The body of the abrasive grain has the dislocation density with an upper limit preferably of $9\times10^{14}/m^2$ or less, more preferably $6.5\times10^{14}/m^2$ or less, more preferably $2\times10^{14}/m^2$ or less, more preferably $5\times10^{13}/m^2$ or less. The body of the abrasive grain has a dislocation density preferably of $1\times10^{8}/m^2$ or more and $9\times10^{14}/m^2$ or less, more preferably $1\times10^{8}/m^2$ or more and $6.5\times10^{14}/m^2$ or less, more preferably $1\times10^{10}/m^2$ or more and $2\times10^{14}/m^2$ or less, still more preferably $5\times10^{10}/m^2$ or more and $5\times10^{13}/m^2$ or less.

The dislocation density of the body of the abrasive grain is measured in SPring-8, a large-scale synchrotron radiation facility (located in Hyogo Prefecture). Specifically, it is measured in the following method.

Powdery cubic boron nitride was prepared. Powder to be measured is introduced into a 0.3 mmφ capillary manufactured by TOHO for X-ray crystallography ("Mark Tube" (trademark) manufactured by TOHO), and thus prepared as a sealed-off specimen.

The specimen was subjected to X-ray diffraction measurement under the following conditions, and a line profile of a diffraction peak from each orientation plane of cubic boron nitride's major orientations which are (111), (200), (220), (311), (400) and (531) is obtained.

(Conditions for X-Ray Diffraction Measurement)
- X-ray source: synchrotron radiation
- Condition for equipment: detector MYTHEN
- Energy: 18 keV (wavelength: 0.6888 angstrom)
- Camera length: 573 mm
- Measurement peak: six peaks from cubic boron nitride's (111), (200), (220), (311), (400), and (531). When it is difficult to obtain a profile depending on texture and orientation, the peak for that Miller index is excluded.
- Measuring condition: there are 9 or more measurement points set in the full width at half maximum corresponding to each measurement peak. Peak top intensity is set to 2000 counts or more. Peak tail is also used in the analysis, and accordingly, the measurement range is set to about 10 times the full width at half maximum.

A line profile obtained from the above X-ray diffraction measurement will be a profile including both a true broadening attributed to a physical quantity such as the sample's inhomogeneous strain and a broadening attributed to the equipment. In order to determine inhomogeneous strain and crystallite size, a component attributed to the equipment is removed from the measured line profile to obtain a true line profile. The true line profile is obtained by fitting the obtained line profile and the line profile that is attributed to the equipment by a pseudo Voigt function, and subtracting the line profile attributed to the equipment. $LaB_6$ was used as a standard sample for removing a broadening of a diffracted peak attributed to the equipment. When significantly collimated radiation is used, a broadening of a diffracted peak attributed to the equipment may be regarded as zero.

The obtained true line profile is analyzed using the modified Williamson-Hall method and the modified Warren-Averbach method to calculate dislocation density. The modified Williamson-Hall method and the modified Warren-Averbach method are known line profile analysis methods used for determining dislocation density.

The modified Williamson-Hall method's expression is represented by the following expression (I):

$$\Delta K = \frac{0.9}{D} + \left(\frac{\pi M^2 b^2}{2}\right)\rho^{1/2}KC^{1/2} + O(K^2 C) \quad (I)$$

where $\Delta K$ represents a half width of a line profile, D represents a crystallite size, M represents a dislocation arrangement parameter, b represents a Burgers vector, $\rho$ represents dislocation density, K represents a scattering vector, $O(K^2C)$ represents a higher-order term of $K^2C$, and C represents an average contrast factor. C in the above expression (I) is represented by the following expression (II):

$$C=C_{h00}[1-q(h^2k^2+h^2l^2+k^2l^2)/(h^2+k^2+l^2)^2] \quad (II).$$

In the above expression (II), a contrast factor $C_{h00}$ for screw dislocation and that for edge dislocation and a coefficient q for each contrast factor are obtained by using the computing code ANIZC, with a slip system of <110> {111}, and elastic stiffness $C_{11}$, $C_{12}$ and $C_{44}$ of 8.44 GPa, 1.9 GPa, and 4.83 GPa, respectively. Contrast factor $C_{h00}$ is 0.203 for screw dislocation and 0.212 for edge dislocation. Note that screw dislocation's ratio is fixed to 0.5 and edge dislocation's ratio is fixed to 0.5.

Furthermore, between dislocation and inhomogeneous strain, a relationship represented by an expression (III) is established using contrast factor C, as below:

$$<\varepsilon(L)^2>=(\rho C b^2/4\pi)\ln(R_e/L) \quad (III),$$

where $R_e$ represents dislocation's effective radius.

By the relationship of the above expression (III) and the Warren-Averbach expression, the following expression (IV) can be presented, and as the modified Warren-Averbach method, dislocation density $\rho$ and a crystallite size can be determined.

$$\ln A(L)=\ln A^S(L)-(\pi L^2 \rho b^2/2)\ln(R_e/L)(K^2C)+O(K^2C)^2 \quad (IV),$$

where $A(L)$ represents a Fourier series, $A^S(L)$ represents a Fourier series for a crystallite size, and L represents a Fourier length. For details of the modified Williamson-Hall method and the modified Warren-Averbach method, see T. Ungar and A. Borbely, "The effect of dislocation contrast on x-ray line broadening: A new approach to line profile analysis," Appl. Phys. Lett., vol. 69, no. 21, p. 3173, 1996, and T. Ungar, S. Ott, P. Sanders, A. Borbely, J. Weertman, "Dislocations, grain size and planar faults in nanostructured copper determined by high resolution X-ray diffraction and a new procedure of peak profile analysis," Acta Mater., vol. 46, no. 10, pp. 3693-3699, 1998.

(Crystal Structure)

The body of the abrasive grain can have a single-crystal structure or a polycrystalline structure. When the body of the abrasive grain has a single-crystal structure, the body of the abrasive grain is easily enhanced in strength. When the body of the abrasive grain has a polycrystalline structure, it helps a tool using abrasive grains having such bodies to have a better grinding ratio.

(Crystal Structure)

The crystal structure of the body of the abrasive grain can be identified by a composite analysis of an X-ray diffraction (XRD) analysis (measuring a peak intensity) (device: "MiniFlex 600" (trademark) manufactured by JOEL Ltd.) and information of the composition of the body of the abrasive grain, or through an observation with a scanning transmission electron microscope (STEM) "JEM-2100F/Cs" (trademark) manufactured by JEOL Ltd. and energy dispersive X-ray (EDX) spectroscopy accompanying the STEM.

(Grain Size of Crystal Grain Constituting Body of Abrasive Grain)

When body 2 of the abrasive grain has a single-crystal structure, the body of the abrasive grain has a grain size corresponding to the grain size of a single-crystal.

When the body of the abrasive grain has a single-crystal structure, a lower limit for the grain size of the single crystal (corresponding to the grain size of the body of the abrasive grain) can be 30 μm or more, 50 μm or more, or 60 μm or more. An upper limit for the grain size of the single crystal can be 600 μm or less, 300 μm or less, or 150 μm or less. The single crystal can have a grain size of 30 μm or more and 600 μm or less, 50 μm or more and 300 μm or less, or 60 μm or more and 150 μm or less.

When body 2 of the abrasive grain has a single-crystal structure, the grain size of the single crystal is measured with a laser diffraction type particle size distribution analyzer (the SALD series manufactured by Shimadzu Corporation).

When body 2 of the abrasive grain has a polycrystalline structure, the body of the abrasive grain is composed of a plurality of crystal grains having an average grain size preferably of 100 nm or more and 6000 nm or less, more preferably 200 nm or more and 4000 nm or less, particularly preferably 300 nm or more and 2000 nm or less.

When body 2 of the abrasive grain has a polycrystalline structure, the average grain size of the plurality of crystal grains constituting the body of the abrasive grain is determined from a cross section of the body of the abrasive grain exposed by a FIB (a focused ion beam), and observed in an HAADF (high-angle annular dark field)-STEM image obtained through an STEM (JEM-ARM200F Dual-X (trademark) produced by JEOL Ltd.). From a difference in contrast of each crystal grain in the HAADF-STEM image, a cross-sectional area of each crystal grain is derived through image analysis software ("WinROOF ver. 7.4.1" (trademark) manufactured by Mitani Corporation), and the diameter of a circle having an area equal to that cross-sectional area (or an equivalent circle diameter) is determined. An average value of the equivalent circle diameters of ten crystal grains is taken as the average grain size of the plurality of crystal grains configuring the body of the abrasive grain.

(Crystallite Constituting Body of Abrasive Grain, and Crystallite Size)

In the present specification, a crystallite that is a constituent of the body of abrasive grain is defined as a region in a single crystal having the same crystal orientation. A crystallite size is defined as a size of a region in a single crystal having the same crystal orientation, and it is defined as a length of a region having the same crystal orientation when the abrasive grain is observed in cross section. In the present specification, a crystallite size corresponds to the equivalent circle diameter of a crystallite.

Preferably, the crystallite size is 250 nm or more. This helps a tool using such abrasive grains to have a better grinding ratio. Although the reason for this is unknown, it is inferred that a larger crystallite size suppresses propagation of cracking during a grinding process, which enhances the abrasive grain in toughness and suppresses a large defect of the abrasive grain during the grinding process.

For the crystallite size, a lower limit of 250 nm or more, 450 nm or more, or 600 nm or more can be set. For the crystallite size, an upper limit of 2000 nm or less, 1500 nm or less, or 1000 nm or less can be set. The crystallite size can be 250 nm or more and 2000 nm or less, 450 nm or more and 1500 nm or less, or 600 nm or more and 1000 nm or less.

The crystallite size is calculated similarly as done when the dislocation density of the body of the abrasive grain is calculated. In the above expression (I), the crystallite size is represented by D.

(Grain Size of Body of Abrasive Grain)

The body of the abrasive grain can have a grain size of 30 μm or more and 600 μm or less, 50 μm or more and 300 μm or less, or 60 μm or more and 150 μm or less. As referred to herein, the grain size of the body of the abrasive grains means the grain size of the body of a single coated super-abrasive grains.

When body 2 of the abrasive grain has a single-crystal structure, the grain size of the body of the abrasive grain, which corresponds to the grain size of a single crystal, is measured with a laser diffraction type particle size distribution analyzer (the SALD series manufactured by Shimadzu Corporation).

When body 2 of the abrasive grain has a polycrystalline structure, the grain size of the body of the abrasive grain is determined from a cross section of the body of the abrasive grain exposed by a FIB (a focused ion beam), and observed in an HAADF (high-angle annular dark field)-STEM image obtained through an STEM (JEM-ARM200F Dual-X (trademark) produced by JEOL Ltd.). From a difference in contrast of each crystal grain in the HAADF-STEM image, a cross-sectional area of the body of the abrasive grain is derived through image analysis software ("WinROOF ver. 7.4.1" (trademark) manufactured by Mitani Corporation), and the diameter of a circle having an area equal to that cross-sectional area (or an equivalent circle diameter) is determined. The equivalent circle diameter corresponds to the grain size of the body of the abrasive grain. An average value of the bodies of ten abrasive grains is taken as the average grain size of the body of the abrasive grain.

[Coating Film]

Coating film 3 coats at least a portion of a surface of body 2 of the abrasive grain. The fact that the coating film coats at least a portion of the surface of body 2 of the abrasive grain can be confirmed in the following method.

A molded body in which coated super-abrasive grains are buried in epoxy resin is produced. The content of the coated super-abrasive grains in the molded body is 50% by volume or more with respect to the resin. The molded body has a shape of a rectangular parallelepiped or a cube.

The molded body is subjected to a CP (cross section polisher) process. This process is performed in two stages. In a first stage of the process, the molded body has any surface processed until a cross section of at least one coated super-abrasive grain is visible. Subsequently, as a second stage of the process, the processed surface is further CP-processed to remove a thickness corresponding to a length equivalent to 50% of the grain size of the coated super-abrasive grain. Note that the grain size of the coated super-abrasive grain is a value as measured with the laser diffraction type particle size distribution analyzer described above.

Subsequently, the cross section of the molded body is observed with an SEM to obtain a backscattered electron image. From the backscattered electron image, it can be confirmed that the coating film coats at least a portion of a surface of body 2 of the abrasive grain.

Coating film 3 preferably coats the entire surface of body 2 of the abrasive grain. The coated super-abrasive grain thus having the coating film can suppress a chemical reaction caused by the body of the abrasive grain and a component of a workpiece while the workpiece is ground. Further, it can prevent atoms constituting the body of the abrasive grain from diffusing into the coating film, the workpiece and the like. This can suppress progression of wear of the body of the abrasive grain and adhesion of the component of the workpiece, and accordingly, grinding force is low and stable for a long period of time. As a result, fracture of the body of the abrasive grain due to adhesion and peeling, increased grinding force, and the like is also reduced. A tool using coated super-abrasive grains of the present disclosure can thus have a high grinding ratio.

Note that a grinding ratio is "the volume of a workpiece ground away/the total worn volume of coated super-abrasive grains." A method for calculating the grinding ratio will be described below.

The coated super-abrasive grains' total worn volume is determined as follows: Before and after a wheel having coated super-abrasive grains fixed thereto is used in a grinding process, the wheel is used to grind a carbon plate to transfer undulations of an abrasive surface of the wheel to the carbon plate. When grinding the carbon plate, the wheel is rotated to cut into the carbon plate without moving the carbon plate.

The cross-sectional shape of the undulations of each carbon plate transferred before the grinding process and that after the grinding process are measured with a stylus type surface roughness meter (SURFCOM (trademark) manufactured by TOKYO SEIMITSU CO., LTD.) in a direction perpendicular to a direction in which the wheel rotates. Two cross-sectional shapes obtained before and after the grinding process are compared to determine the reduced area. Let "(the reduced area)×(the diameter of the wheel)×π" be the total worn volume of the coated super-abrasive grains.

A volume of the workpiece that is ground away (hereinafter also referred to as a "removed amount in volume") is determined by the product of a cutting depth and the workpiece's length and thickness. Material's removed amount in volume is represented by a horizontal axis and a worn amount is represented by a vertical axis to plot a change, and therefrom a linear function of the change is determined by the method of least squares to calculate a gradient. This is used to calculate the coated super-abrasive grains' total worn volume for any removed amount in volume.

(Composition)

Coating film 3 includes one or more types of compounds composed of at least one type of element selected from the group consisting of a Group 4 element (titanium (Ti), zirconium (Zr), hafnium (Hf) and the like), a Group 5 element (vanadium (V), niobium (Nb), tantalum (Ta) and the like), and a Group 6 element (chromium (Cr), molybdenum (Mo), tungsten (W) and the like) in the Periodic Table, aluminum and silicon, and at least one type of element selected from the group consisting of oxygen, nitrogen, carbon and boron. This suppresses damages such as wear and destruction of the coating film and the body of the abrasive grain. A tool using coated super-abrasive grains of the present disclosure can thus have a high grinding ratio.

Examples of a compound composed of the first element and nitrogen (i.e., a nitride) include titanium nitride (TiN), zirconium nitride (ZrN), hafnium nitride (HfN), vanadium nitride (VN), niobium nitride (NbN), tantalum nitride (TaN), chromium nitride ($Cr_2N$), molybdenum nitride (MoN), tungsten nitride (WN), titanium zirconium nitride (TiZrN), titanium hafnium nitride (TiHfN), titanium vanadium nitride (TiVN), titanium niobium nitride (TiNbN), titanium tantalum nitride (TiTaN), titanium chromium nitride (TiCrN), titanium molybdenum nitride (TiMoN), titanium tungsten nitride (TiWN), zirconium hafnium nitride (ZrHfN), zirconium vanadium nitride (ZrVN), zirconium niobium nitride (ZrNbN), zirconium tantalum nitride (ZrTaN), zirconium chromium nitride (ZrCrN), zirconium molybdenum nitride (ZrMoN), zirconium tungsten nitride (ZrWN), hafnium vanadium nitride (HfVN), hafnium niobium nitride (HfNbN), hafnium tantalum nitride (HfTaN), hafnium chromium nitride (HfCrN), hafnium molybdenum nitride (HfMoN), hafnium tungsten nitride (HfWN), vanadium niobium nitride (VNbN), vanadium tantalum nitride (VTaN), vanadium chromium nitride (VCrN), vanadium molybdenum nitride (VMoN), vanadium tungsten nitride (VWN), niobium tantalum nitride (NbTaN), niobium chromium nitride (NbCrN), niobium molybdenum nitride (NbMoN), niobium tungsten nitride (NbWN), tantalum chromium nitride (TaCrN), tantalum molybdenum nitride (TaMoN), tantalum tungsten nitride (TaWN), chromium molybdenum nitride (CrMoN), chromium tungsten nitride (CrWN), molybdenum tungsten nitride (MoWN), aluminum nitride (AlN), and silicon nitride ($Si_3N_4$).

Examples of a compound composed of the first element and carbon (i.e. a carbide) can include titanium carbide (TiC), zirconium carbide (ZrC), hafnium carbide (HfC), vanadium carbide (VC), niobium carbide (NbC), tantalum carbide (TaC), chromium carbide ($Cr_2C$), molybdenum carbide (MoC), tungsten carbide (WC), titanium zirconium carbide (TiZrC), titanium hafnium carbide (TiHfC), titanium vanadium carbide (TiVC), titanium niobium carbide (TiNbC), titanium tantalum carbide (TiTaC), titanium chromium carbide (TiCrC), titanium molybdenum carbide (TiMoC), titanium tungsten carbide (TiWC), zirconium hafnium carbide (ZrHfC), zirconium vanadium carbide (ZrVC), zirconium niobium carbide (ZrNbC), zirconium tantalum carbide (ZrTaC), zirconium chromium carbide (ZrCrC), zirconium molybdenum carbide (ZrMoC), zirconium tungsten carbide (ZrWC), hafnium vanadium carbide (HfVC), hafnium niobium carbide (HfNbC), hafnium tantalum carbide (HfTaC), hafnium chromium carbide (HfCrC), hafnium molybdenum carbide (HfMoC), hafnium tungsten carbide (HfWC), vanadium niobium carbide (VNbC), vanadium tantalum carbide (VTaC), vanadium chromium carbide (VCrC), vanadium molybdenum carbide (VMoC), vanadium tungsten carbide (VWC), niobium tantalum carbide (NbTaC), niobium chromium carbide (NbCrC), niobium molybdenum carbide (NbMoC), niobium tungsten carbide (NbWC), tantalum chromium carbide (TaCrC), tantalum molybdenum carbide (TaMoC), tantalum tungsten carbide (TaWC), chromium molybdenum carbide (CrMoC), chromium tungsten carbide (CrWC), molybdenum tungsten carbide (MoWC), aluminum carbide ($Al_4C_3$), and silicon carbide (SiC).

Examples of a compound composed of the first element, carbon and nitrogen (i.e., a carbonitride) can include titanium carbonitride (TiCN), zirconium carbonitride (ZrCN), hafnium carbonitride (HfCN), aluminium carbonitride (AlCN), and silicon carbonitride (SiCN).

Examples of a compound composed of the first metal element and boron (i.e., a boride) can include titanium boride ($TiB_2$), zirconium boride ($ZrB_2$), hafnium boride ($HfB_2$), vanadium boride ($VB_2$), niobium boride ($NbB_2$), tantalum boride ($TaB_2$), chromium boride ($CrB_2$), molybdenum boride ($MoB_2$), tungsten boride (WB), aluminum boride ($AlB_2$), and silicon boride ($SiB_4$).

Examples of a compound composed of the first metal element and oxygen (i.e., an oxide) can include titanium oxide ($TiO_2$), zirconium oxide ($ZrO_2$), hafnium oxide ($HfO_2$), vanadium oxide ($V_2O_5$), niobium oxide ($Nb_2O_5$), tantalum oxide ($Ta_2O_5$), chromium oxide ($Cr_2O_3$), molybdenum oxide ($MoO_3$), tungsten oxide ($WO_3$), aluminum oxide ($Al_2O_3$), and silicon oxide ($SiO_2$).

Examples of a compound composed of the first metal element, nitrogen and oxygen (i.e., an oxynitride) can include titanium oxynitride (TiON), zirconium oxynitride (ZrON), hafnium oxynitride (HfON), vanadium oxynitride (VON), niobium oxynitride (NbON), tantalum oxynitride (TaON), chromium oxynitride (CrON), molybdenum oxynitride (MoON), tungsten oxynitride (WON), aluminum oxynitride (AlON), silicon oxynitride (SiON), and sialon (SiAlON).

The above compound may be one type of compound or two or more types of compounds in combination. The coating film can include a solid solution derived from the above compound. The solid solution derived from the above compound means a state in which two or more types of the above compounds are dissolved in each other's crystal structure, and means an interstitial solid solution, a substitutional solid solution or the like.

The coating film preferably includes the above compound and the solid solution derived from the above compound in a total amount of 0% by volume or more and 90% by volume or less, more preferably 5% by volume or more and 70% by volume or less, still more preferably 10% by volume or more and 50% by volume or less.

Preferably, the coating film includes aluminum and oxygen. This enhances the coating film in stability against heat and enhances wear resistance. As a result, damages such as wear and destruction of the coating film and the body of the abrasive grain are suppressed.

A compound including aluminum and oxygen includes $Al_2O_3$ (alumina). For $Al_2O_3$, there exist crystal structures such as $\alpha$-$Al_2O_3$, $\gamma$-$Al_2O_3$, $\delta$-$Al_2O_3$, $\eta$-$Al_2O_3$, $\theta$-$Al_2O_3$, $\kappa$-$Al_2O_3$, $\rho$-$Al_2O_3$, $\chi$-$Al_2O_3$. The coating film can include any of these crystal structures. While $Al_2O_3$ (alumina) has an atomic ratio of Al and O of 2:3, $Al_2O_3$ (alumina) in the present invention does not necessarily have an atomic ratio of Al and O that completely matches 2:3, and may be within a range as will be described hereinafter.

The coating film preferably includes the compound including aluminum and oxygen in a total amount preferably of 10% by volume or more and 100% by volume or less, more preferably 30% by volume or more and 95% by volume or less, still more preferably 50% by volume or more and 90% by volume or less.

Coating film 3 preferably includes $\gamma$-$Al_2O_3$. This allows the coating film to be composed of a plurality of crystal grains having a reduced average grain size, and thus allows the coating film to be enhanced in strength and also enhances adhesive strength between the coating film and the body of the abrasive grain. This in turn suppresses destruction and peeling of the film due to impact caused as the film comes into contact with a workpiece. Therefore, the coating film can maintain satisfactory wear resistance for a long period of time.

In the coating film, aluminum and oxygen preferably have an atomic ratio Al/O of 0.2 or more and 0.9 or less. This further enhances the coating film in wear resistance and also enhances adhesive strength between the coating film and the body of the abrasive grain.

Aluminum and oxygen have an atomic ratio Al/O more preferably of 0.4 or more and 0.7 or less, still more preferably 0.45 or more and 0.65 or less. This further enhances the coating film in wear resistance and also further enhances adhesive strength between the coating film and the body of the abrasive grain.

A method for measuring the atomic ratio of aluminum and oxygen in the coating film is as follows: The coated superabrasive grain is subjected to inductively coupled high frequency plasma spectroscopy (ICP) and inert gas fusion to measure an Al content and an oxygen content, respectively. These are converted into atomic percentages to calculate an atomic ratio.

Coating film 3 may include inevitable impurities, a trace amount of unreacted metal aluminum remaining through a coating film forming process, an amorphous component of a compound including aluminum and oxygen, and the like. Examples of the inevitable impurities include trace amounts of iron (Fe), nickel (Ni), chromium (Cr), manganese (Mn), and carbon (C) derived from a jig (mainly, SUS, carbon and the like) used during the manufacturing process.

The coating film preferably contains the inevitable impurities in an amount by mass of 0.001% or more and 0.5% or less, more preferably 0.001% or more and 0.1% or less.

The composition of coating film 3 is analyzed through SEM-EDS analysis and ICP analysis for qualitative evaluation and quantitative analysis, respectively. SEM-EDS analysis is conducted under the same measuring conditions as the analysis of the composition of the body of the abrasive grain and ICP analysis is conducted under the same measuring conditions as the method for analyzing the atomic ratio of aluminum and oxygen in the coating film, and accordingly, they will not be described repeatedly.

(Average Grain Size of a Plurality of Crystal Grains Constituting the Coating Film)

Coating film 3 can be a polycrystal including a plurality of crystal grains. In this case, the plurality of crystal grains preferably have an average grain size of 500 nm or less. This further enhances the coating film in strength, and thus facilitates suppressing damage to coating film 3 per se that is caused by an impactive force (or stress) caused as the abrasive grain is brought into contact with a workpiece. Further, this facilitates alleviating impactive force acting on body 2 of the abrasive grain as it is brought into contact with the workpiece, and body 2 of the abrasive grain is less likely to be damaged. The smaller the average grain size of coating film 3 is, the larger the strength of coating film 3 per se can be.

An upper limit for the average grain size of the plurality of crystal grains included in the coating film is preferably 500 nm or less, more preferably 100 nm or less, still more preferably 50 nm or less. A lower limit for the average grain size is preferably 1 nm or more, more preferably 5 nm or more, still more preferably 10 nm or more. The average grain size is preferably 1 nm or more and 500 nm or less, more preferably 5 nm or more and 100 nm or less, still more preferably 10 nm or more and 50 nm or less.

The average grain size of the plurality of crystal grains included in the coating film is calculated using a HAADF- STEM image obtained through a STEM. Specifically, it is calculated in the following method.

Initially, when the coating film has a thickness exceeding 100 nm, the coating film is mechanically polished and subjected to Ar-ion milling to have a thickness of 100 nm or less. This operation is unnecessary when the coating film is 100 nm or less in thickness.

The STEM has a magnification set to 6.5 million times and it is thus used to observe a HAADF-STEM image of the coating film to determine any ten or more areas in which an atomic arrangement is observable. One area where the atomic arrangement is observable is taken as one crystal grain. In a HAADF-STEM image, a crystal grain different in crystal orientation is unobservable, and an area where an atomic arrangement is observable can be regarded as a crystal grain. The equivalent circle diameter of one area in which an atomic arrangement is observable is regarded as one crystal grain. The equivalent circle diameter can be calculated using image analysis software ("WinROOF ver. 7.4.1" (trademark) manufactured by Mitani Corporation). An average grain size of the ten or more crystal grains is taken as an average grain size of the plurality of crystal grains included in the coating film.

(Crystal Structure of Coating Film)

The coating film undergoes a crystal structure analysis in order to identify a coating substance in the following method:

The coating film's crystal structure is analyzed through STEM observation accompanying energy dispersive X-ray (EDS) and X-ray diffraction (using "MiniFlex600" (trademark) manufactured by JOEL Ltd. as an instrument) in a composite manner. EDS is measured under general conditions. XRD is observed under the following conditions:

X-ray diffractometer: "MiniFlex600" (trademark) manufactured by JOEL
Characteristic X-ray: Cu-Kα (wavelength: 1.54 angstrom)
Tube voltage: 45 kV
Tube current: 40 mA
Filter: Multi-layer mirror
Optical system: Concentration method
X-ray diffractometry: θ-2θ method By analyzing the coating film's electron diffraction, whether the coating film contains amorphous can be verified.

(Structure)

Coating film 3 can have a monolayer structure. As shown in FIG. 2, coating film 3 can have a multilayer structure composed of two or more types of unit layers. When the coating film has a multilayer structure, each unit layer's residual stress increases. This enhances the coating film in hardness and thus suppresses damage to the coating film.

When the coating film has a multilayer structure, the number of layers is not particularly limited. For example, two or three layers may be used. In this case, adjacent unit layers preferably have different compositions. For example, when coating film 3 has a three-layer structure (FIG. 2), and a first unit layer 31, a second unit layer 32, and a third unit layer 33 are sequentially formed outward from the side of body 2 of the abrasive grain, first unit layer 31 and third unit layer 33 can have the same composition, and second unit layer 32 can have a composition different from that of first unit layer 31 and third unit layer 33. Further, first unit layer 31, second unit layer 32, and third unit layer 33 may all have different compositions. The structure of coating film 3 can be analyzed through a cross-sectional observation with an STEM.

(Thickness)

Coating film 3 preferably has a thickness of 50 nm or more and 1000 nm or less. When the coating film has a thickness of 50 nm or more, it facilitates enhancing the coating film per se in wear resistance and hence suppressing damage to the coating film and the body of the abrasive grain. When the coating film has a thickness of 1000 nm or less, the coating film does not have an excessively large thickness and thus does not easily peel off, and a state with the coating film formed on an external surface of the body of the abrasive grain is easily maintained.

When coating film 3 has a multilayer structure the thickness of coating film 3 is the sum of each layer in thickness. When coating film 3 has a multilayer structure, each layer may be equal or different in thickness.

A lower limit for the coating film in thickness is preferably 50 nm or more, more preferably 100 nm or more, still more preferably 150 nm or more. An upper limit for the coating film in thickness is preferably 1000 nm or less, more preferably 500 nm or less, still more preferably 300 nm or less. The coating film has a thickness more preferably of 100 nm or more and 500 nm or less, still more preferably 150 nm or more and 300 nm or less.

In the present specification, the thickness of the coating film means an average value in thickness of the coating films of 10 coated super-abrasive grains randomly selected. The thickness of the coating film of each coated super-abrasive grain for calculating the average value is a value calculated in the following method.

Initially, a molded body in which a plurality of coated super-abrasive grains are buried in epoxy resin is produced. The content of the coated super-abrasive grains in the molded body is 50% by volume or more with respect to the resin. The molded body has a shape of a rectangular parallelepiped or a cube.

The molded body is subjected to a CP (cross section polisher) process. This process is performed in two stages. In a first stage of the process, the molded body has any surface processed until a cross section of at least one coated super-abrasive grain is visible. Subsequently, as a second stage of the process, the processed surface is further CP-processed to remove a thickness corresponding to a length equivalent to 50% of the grain size of the coated super-abrasive grain. Note that the grain size of the coated super-abrasive grain is a value as measured with the laser diffraction type particle size distribution analyzer described above.

Subsequently, the cross section of the molded body is observed with an SEM to obtain a backscattered electron image. In the backscattered electron image, three portions of the coating film of a single coated super-abrasive grain are randomly selected and measured in thickness. An average value in thickness of the three portions is defined as the thickness of the coating film of the coated super-abrasive grain.

(Method for Producing Coated Super-Abrasive Grains)

A method for producing coated super-abrasive grains can comprise the steps of: preparing a body of the abrasive grain made of cubic boron nitride (hereinafter also referred to as a "preparation step"), pre-treating the body of the abrasive grain (hereinafter also be referred to as a "pre-coating treatment step"), and forming a coating film on a surface of the body of the abrasive grain (hereinafter also referred to as a "coating step").

(Preparation Step)

Cubic boron nitride as a raw material for the body of the abrasive grain is prepared. The cubic boron nitride is not particularly limited, and any known cubic boron nitride can be used.

(Pre-Coating Treatment Step)

The prepared body of the abrasive grain made of cubic boron nitride is subjected to pre-treatment. This can reduce dislocation density of the body of the abrasive grain. Examples of the pre-treatment include heat treatment, electron beam exposure, plasma exposure, and microwave exposure.

The heat treatment can be carried out in a vacuum at a temperature of 850 to 1400° C. for 15 to 300 minutes, for example. This can sufficiently reduce dislocation density of the body of the abrasive grain. The temperature is preferably higher than that in a post-coating heat treatment step described hereinafter.

The electron beam exposure can be performed with an exposure energy of 10 to 40 MeV for 3 to 20 hours, for example. This can sufficiently reduce dislocation density of the body of the abrasive grain.

(Coating Step)

Subsequently, a coating film is formed on a surface of the body of the abrasive grain subjected to the heat treatment. The coating film is formed by: arc ion plating (AIP), High Power Impulse Magnetron Sputtering (HIPIMS), an arc plasma powder method or similar physical vapor deposition; spray pyrolysis, Metalorganic Chemical Vapor Deposition or (MOCVD) or similar chemical vapor deposition; or the like. Inter alia, the arc plasma powder method is optimal.

The coating is applied under conditions including a target material of at least one simple substance selected from a group 4 element, a group 5 element and a group 6 element in the periodic table, aluminum, silicon and carbon, or an alloy or a compound thereof, an atmosphere including at least one of oxygen, nitrogen and argon, a discharge voltage of 10 V or more and 200 V or less, a discharge frequency of 1 Hz or more and 20 Hz or less, a capacitor having a capacitance of 360 µF or more and 1800 µF or less, and a shot count of 1,000 or more and 10,000,000 or less. Thus, a coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron can be formed on a surface of the body of the abrasive grain.

(Post-Covering Heat Treatment Step)

After the coating film is formed, a post-coating heat treatment step is preferably performed. Immediately after the coating film is formed, the coating film is mainly amorphous, and by applying appropriate heat treatment, the coating film can be structurally controlled, and adhesive strength between the coating film and the body of the abrasive grain can also be enhanced.

For example, for aluminum oxide, heat treatment at 700° C. or higher starts to generate $\gamma$-$Al_2O_3$ and at 1200° C. or higher starts to generate $\alpha$-$Al_2O_3$. Such a phase transition of a crystal structure involves a change in volume, and inconsistency may be caused at an interface between the coating film and the body of the abrasive grain. When the heat treatment has high temperature, the coating film tends to be composed of crystal grains having an increased grain size. When the heat treatment has low temperature, the coating film tends to be composed of crystal grains having a decreased grain size.

For example, when the heat treatment is applied at a temperature of 800 to 1000° C. for 30 to 240 minutes, it can cause the coating film to contain $\gamma$-$Al_2O_3$ and be composed of a plurality of crystal grains having an average grain size of 500 nm or less so that high hardness can be provided, inconsistency at an interface between the body of the abrasive grain and the coating film can be suppressed, and close adhesion without a gap can be achieved by interdiffusion of atoms between the body of the abrasive grain and the coating film. A trace amount of unreacted metal aluminum, an amorphous component of aluminum and oxygen, and the like may remain.

An atomic ratio of aluminum and oxygen (Al/O) included in the coating film can be controlled by arc plasma powder, the oxygen partial pressure of the atmosphere in the heat treatment or the like. The atomic ratio (Al/O) increases when the oxygen partial pressure is reduced, and decreases when the oxygen partial pressure is increased. An atomic ratio (Al/O) of 0.2 or more facilitates generating $\gamma$-$Al_2O_3$, an atomic ratio (Al/O) of 0.9 or less allows insulation to be maintained, and an atomic ratio (Al/O) of 0.4 or more and 0.7 or less allows a most improved grinding ratio.

[Application]

The coated super-abrasive grain according to the first embodiment is suitably applicable as abrasive grains for a grinding tool (a grindstone) such as a wheel.

Second Embodiment: Abrasive Grain

An abrasive grain in one embodiment of the present disclosure is composed of cubic boron nitride and has a dislocation density of $9 \times 10^{14}/m^2$ or less. A tool using abrasive grains of the present disclosure can have a high grinding ratio. A reason for this is inferred as indicated below:

The abrasive grain of the present disclosure has a low dislocation density. The low dislocation density enhances the abrasive grain in toughness. The abrasive grain of the present disclosure is thus free from significant defects during a grinding process. A tool using abrasive grains of the present disclosure can thus have a high grinding ratio.

The abrasive grain of the second embodiment can have the same configuration as the body of the abrasive grain included in the coated super-abrasive grain of the first embodiment. That is, the body of the abrasive grain of the first embodiment that is alone used as an abrasive grain is the abrasive grain of the second embodiment.

The abrasive grain of the second embodiment can be configured to be identical to the body of the abrasive grain included in the coated super-abrasive grain of the first embodiment in: composition; dislocation density; crystal structure; crystal structure; grain size of crystal grains constituting the abrasive grain; a crystallite that is a constituent of the abrasive grain, and crystallite size; average grain size of crystal grains constituting the abrasive grain; and application.

(Dislocation Density)

The abrasive grain has a dislocation density of $9 \times 10^{14}/m^2$ or less. When the abrasive grain has a dislocation density of $9 \times 10^{14}/m^2$ or less, it allows the abrasive grain to be excellent in toughness. In addition, there are few lattice defects in the abrasive grain, which can reduce defects caused while grinding. A tool using abrasive grains of the present disclosure can thus have a high grinding ratio.

A lower limit for the dislocation density of the abrasive grain is preferably $1 \times 10^8/m^2$ or more, more preferably $1 \times 10^{10}/m^2$ or more, still more preferably $5 \times 10^{10}/m^2$ or more. An upper limit for the dislocation density of the abrasive grain is $9\times10^{14}/m^2$ or less, preferably $6.5\times10^{14}/m^2$ or less, more preferably $2\times10^{14}/m^2$ or less, still more preferably $5\times10^{13}/m^2$ or less. The abrasive grain preferably has a dislocation density of $1\times10^8/m^2$ or more and $9\times10^{14}/m^2$ or less, more preferably $1\times10^8/m^2$ or more and $6.5\times10^{14}/m^2$ or less, more preferably $1\times10^{10}/m^2$ or more and $2\times10^{14}/m^2$ or less, still more preferably $5\times10^{10}/m^2$ or more and $5\times10^{13}/m^2$ or less.

How the abrasive grain's dislocation density is measured is the same as the method for measuring the dislocation density of the body of the abrasive grain as described in the first embodiment, and accordingly, it will not be described repeatedly.

(Crystal Structure)

The abrasive grain can have a single-crystal structure or a polycrystalline structure. When the abrasive grain has a single-crystal structure, the abrasive grain is easily enhanced in strength. When the abrasive grain has a polycrystalline structure, it helps a tool using such abrasive grains to have a better grinding ratio.

(Size of Crystallite Constituting the Abrasive Grain (Crystallite Size))

The abrasive grain is preferably composed of crystallite having a size (a crystallite size) of 250 nm or more. This helps a tool using such abrasive grains to have a better grinding ratio. Although the reason for this is unknown, it is inferred that a larger crystallite size suppresses propagation of cracking during a grinding process, which enhances the abrasive grain in toughness and suppresses a large defect of the abrasive grain during the grinding process.

For the crystallite size, a lower limit of 250 nm or more, 450 nm or more, or 600 nm or more can be set. For the crystallite size, an upper limit of 2000 nm or less, 1500 nm or less, or 1000 nm or less can be set. The crystallite size can be 250 nm or more and 2000 nm or less, 450 nm or more and 1500 nm or less, or 600 nm or more and 1000 nm or less.

How the crystallite size is measured is the same as the method for measuring the crystallite size of the body of the abrasive grain as described in the first embodiment, and accordingly, it will not be described repeatedly.

(Grain Size of Abrasive Grain)

The abrasive grain preferably has a grain size of 30 μm or more and 600 μm or less. Herein, the grain size of the abrasive grain means the grain size of a single abrasive grain.

The abrasive grain having a grain size of 30 μm or more is not excessively small and is thus easily fixed to a wheel and hence facilitates grinding a workpiece, and in addition, it is also easily handled and hence facilitates constructing the wheel. The abrasive grain having a grain size of 600 μm or less is not excessively large and thus not easily fractured or similarly damaged due to an impactive force acting on the abrasive grain as it is brought into contact with a workpiece.

The abrasive grain has a grain size with a lower limit preferably of 30 μm or more, more preferably 50 μm or more, still more preferably 60 μm or more. The abrasive grain has the grain size with an upper limit preferably of 600 μm or less, more preferably 300 μm or less, still more preferably 150 μm or less. The abrasive grain can have a grain size of 30 μm or more and 600 μm or less, 50 μm or more and 300 μm or less, or 60 μm or more and 150 μm or less.

The grain size of the abrasive grain is measured with a laser diffraction type particle size distribution analyzer (the SALD series manufactured by Shimadzu Corporation).

Other details in configuration of the abrasive grain than the above are described in the first embodiment, and accordingly, will not be described repeatedly.

A method for producing the abrasive grain of the present disclosure can comprise the steps of: preparing a precursor made of cubic boron nitride for the abrasive grain; and subjecting the precursor to heat treatment, electron beam exposure, plasma exposure, or microwave exposure to obtain the abrasive grain. This can provide an abrasive grain composed of cubic boron nitride and having a reduced dislocation density. Under what specific conditions the heat treatment is performed can be the same as the pre-coating heat treatment step of the first embodiment, and accordingly, it will not be described repeatedly.

Third Embodiment: Wheel

Figure 3:
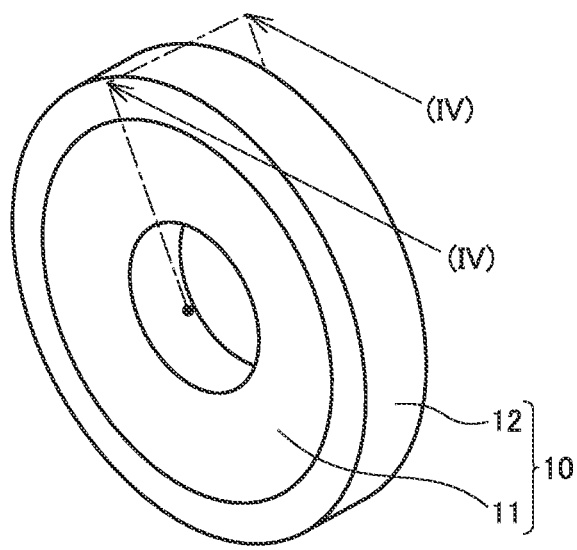
FIG. 3 is a schematic perspective view of a wheel according to a third embodiment.
Figure 4:
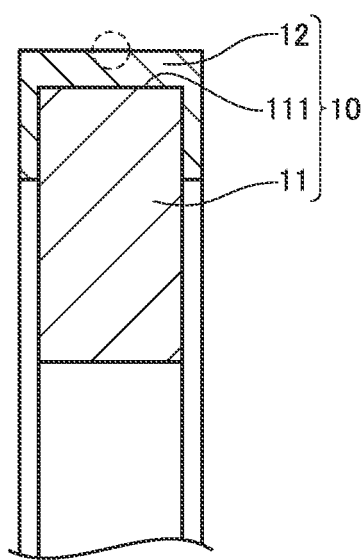
FIG. 4 is a cross section of the wheel shown in FIG. 3 as cut along a plane including a line (IV)-(IV).
Figure 5:
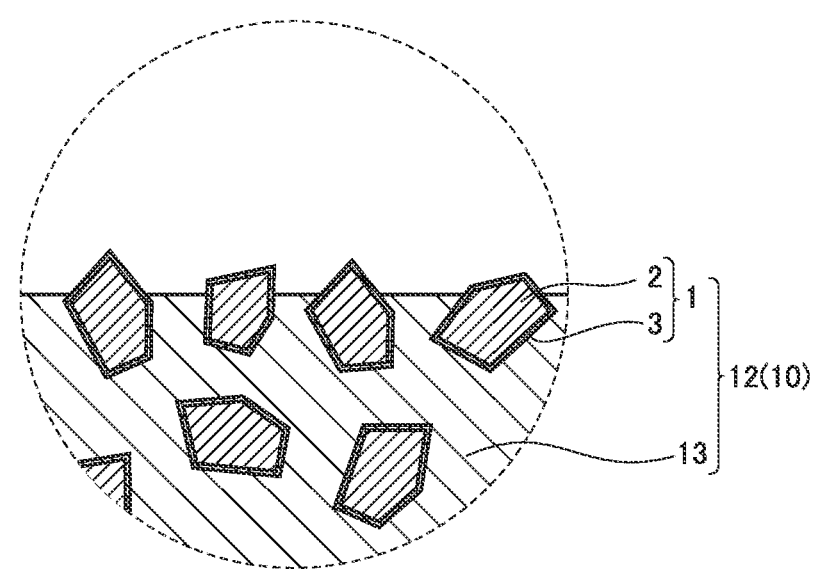
FIG. 5 is an enlarged cross section of a portion of the wheel shown in FIG. 4 that is surrounded by a circle drawn with a broken line.

A wheel according to an embodiment of the present disclosure will now be described with reference to FIGS. 3 to 5. FIG. 3 is a schematic perspective view of a wheel according to the third embodiment. FIG. 4 is a cross section of the wheel shown in FIG. 3 as cut along a plane including a line (IV)-(IV). FIG. 5 is an enlarged cross section of a portion of the wheel shown in FIG. 4 that is surrounded by a circle drawn with a broken line.

While FIGS. 3 to 5 show a case where a wheel has a super-abrasive layer including the coated super-abrasive grain of the first embodiment, this is not exclusive. The super-abrasive layer may include the abrasive grain of the second embodiment instead of the coated super-abrasive grain. The super-abrasive layer may include both the coated super-abrasive grain and the abrasive grain. While in the following description will be described a case where the super-abrasive layer includes the coated super-abrasive grain, when the super-abrasive layer includes the abrasive grain a case where the super-abrasive layer includes the coated super-abrasive grain and the abrasive grain is also included in the present embodiment.

Wheel 10 includes a disk-shaped substrate 11 and a super-abrasive grain layer 12 covering at least an outer peripheral surface of substrate 11, and super-abrasive grain layer 12 is a wheel having coated super-abrasive grain 1 of the first embodiment or the abrasive grain of the second embodiment. Wheel 10 comprises coated super-abrasive grain 1 resistant to damage, and thus has a high grinding ratio.

[Substrate]

Substrate 11 is formed of material including Al and an Al alloy, iron and an iron alloy, carbon tool steel, high speed tool steel, alloy tool steel, cemented carbide, cermet and the like. Substrate 11 can have a size (inner and outer diameters and thickness) selectable as appropriate depending for example on the size of a machine tool such as a machining center on which wheel 10 is installed, that is, depending on the size of the workpiece. Substrate 11 can be a substrate for a known wheel.

[Super-Abrasive Grain Layer]

Super-abrasive grain layer 12 in this example is formed to cover front and outer peripheral end surfaces of outer peripheral surface 111 of substrate 11 continuously (see FIGS. 3 and 4). Super-abrasive grain layer 12 can be selected in size (thickness and width), as appropriate, depending on the size (thickness and width) of substrate 11. The thickness refers to a length in the radial direction of wheel 10, and the width refers to a length in the axial direction of wheel 10. Super-abrasive grain layer 12 includes coated super-abrasive grain 1 and a bonding material 13 (see FIG. 5).

(Coated Super-Abrasive Grain)

Coated super-abrasive grain 1 is the coated super-abrasive grain of the first embodiment. Coated super-abrasive grain 1 can be a plurality of such coated super-abrasive grains. Super-abrasive grain layer 12 on the side of its front surface has coated super-abrasive grains 1 partially exposed from bonding material 13 to provide a cutting edge portion to grind a workpiece.

In contrast, super-abrasive grain layer 12 on the side of substrate 11 has coated super-abrasive grains 1 all buried in bonding material 13. Coated super-abrasive grains 1 that are buried are partially exposed from bonding material 13 and thus grind a workpiece during a process in which while the workpiece is ground by wheel 10 coated super-abrasive grains 1 on the side of the front surface of super-abrasive grain layer 12 are worn and fall off and bonding material 13 is also worn.

The plurality of coated super-abrasive grains 1 may all have their respective bodies 2 identically configured (i.e., identical in material, equal in size and the like) and their respective coating films 3 identically configured (i.e., identical in material, equal in thickness and the like). Some coated super-abrasive grains 1 may have body 2 and coating film 3 different in configuration (i.e., material, size, and the like) than other coated super-abrasive grains 1. Super-abrasive grain layer 12 may have mixed therein known abrasive grains other than super-abrasive grain 1.

A lower limit for the average grain size (a volume-based median diameter d50) of the plurality of coated super-abrasive grains included in the super-abrasive grain layer is preferably 30 μm, preferably 40 μm, preferably 50 μm, preferably 60 μm. An upper limit for the average grain size (the volume-based median diameter d50) of the plurality of coated super-abrasive grains is preferably 600 μm, preferably 400 μm, preferably 300 μm, preferably 150 μm. The plurality of coated super-abrasive grains have an average grain size (a volume-based median diameter d50) preferably of 30 μm or more and 600 μm or less, preferably 40 μm or more and 400 μm or less, preferably 50 μm or more and 300 μm or less, preferably 60 μm or more and 150 μm or less.

The average grain size of the plurality of coated super-abrasive grains is determined by immersing the super-abrasive grain layer in an acid (for example, aqua regia (a liquid of a mixture of concentrated hydrochloric acid and concentrated nitric acid at a volume ratio of 3:1)), dissolving the bonding material in the acid, extracting the plurality of coated super-abrasive grains alone, and measuring the extracted plurality of coated super-abrasive grains with a laser diffraction type particle size distribution analyzer. When the super-abrasive grain layer is a large layer, the super-abrasive grain layer is cut off by a predetermined volume (for example of 0.5 cm$^3$) and from the cut portion the bonding material is dissolved as described above to extract a plurality of coated super-abrasive grains.

(Bonding Material)

Bonding material 13 fixes coated super-abrasive grains 1 to outer peripheral surface 111 (FIG. 4). Bonding material 13 includes in type one type selected from resin bond, metal bond, vitrified bond, electroplated bond and a combination thereof, or metal wax, for example. These bonds and metal wax can be known bonds and metal wax.

For example, the resin bond includes as a main component a thermosetting resin such as phenol resin, epoxy resin, and polyimide resin. The metal bond includes as a main component an alloy including copper, tin, iron, cobalt, or nickel. The vitrified bond includes a vitreous material as a main component. The electroplated bond includes nickel plating. The metal wax includes silver (Ag) wax and the like.

The type of bonding material 13 can be appropriately selected depending on what material coating film 3 of coated super-abrasive grain 1 is composed of, or the like. For example, when coating film 3 of coated super-abrasive grain 1 is electrically conductive, then, as bonding material 13, electroplated bond is excluded, and resin bond, metal bond, vitrified bond, and metal wax can be used. When coating film 3 of coated super-abrasive grain 1 has an insulating property, all the above bonds including electroplated bond and metal wax can be used.

Wheel 10 (see FIG. 3) can be produced as follows: a plurality of coated super-abrasive grains 1 each comprising body 2 having a surface at least partially coated with coating film 3 (see FIG. 1) are prepared and fixed to outer peripheral surface 111 of substrate 11 by using bonding material 13 (see FIG. 5). Alternatively, wheel 10 may be produced as follows: a plurality of bodies 2 for abrasive grains that are uncoated with coating film 3 are prepared and fixed to outer peripheral surface 111 of substrate 11 by using bonding material 13, and thereafter, bodies 2 have their surfaces (or a cutting edge portion) coated with coating film 3. In that case, the coating can be done in any of the AIP, HIPIMS, CVD and arc plasma powder methods mentioned above.

(Application)

Wheel 10 according to an embodiment is suitably applicable to grinding automobile parts, optical glass, magnetic materials, semiconductor materials, and the like, grinding to form grooves for end mills, drills and reamers and the like, grinding to form a breaker for an indexable insert, and heavy duty grinding for various tools.

EXAMPLES

The embodiments will now be described more specifically with reference to examples. However, the embodiments are not limited by these examples.

Example 1

<Producing Coated Super-Abrasive Grain and Abrasive Grain>

(Sample 1 to Sample 6, Sample 9 to Sample 18, Sample 20 to Sample 23)

For each sample, single-crystal cubic boron nitride was prepared as the body of an abrasive grain. The body of the abrasive grain prepared for each sample has an average grain size as indicated in Table 1, a "body of abrasive grain" column, the "average grain size (μm)" sub-column. For example, for Sample 1, the body of the abrasive grain has an average grain size of 75 μm.

A vacuum heat treatment furnace ("NRF-658-0.7D1.5V" produced by Nihon-tokusyukikai) was used to apply heat treatment as a pre-coating treatment to the cubic boron nitride. The heat treatment was conducted under conditions (for atmosphere, temperature and time) as indicated in Table 1, the "pre-coating heat treatment" column, the "atmosphere," "temperature," and "time" subcolumns. For example, for Sample 1, heat treatment was performed in a vacuum, which means $1\times10^{-3}$ Pa or less at 900° C. for 0.5 hour.

After the pre-coating heat treatment, a coating film was formed on the entire surface of the cubic boron nitride in the arc plasma powder method. The coating was done with a coating apparatus set under conditions, as indicated below.

Coating apparatus: Nanoparticle formation apparatus APD-P produced by ADVANCE RIKO, Inc.
Target: aluminum
Introduced gas: $O_2$
Deposition pressure: as indicated in Table 1, the "condition for atmosphere when forming the coating film" column.
Discharge voltage: 150 V
Discharge frequency: 6 Hz
Capacitor's capacitance: 1080 μF
Amount of powder processed: 30 g
Speed of rotation of powder container: 50 rpm After the coating film was formed on the surfaces of particles of cubic boron nitride, the above vacuum heat treatment furnace was used to perform the post-coating heat treatment to obtain coated super-abrasive grains. The post-coating heat treatment is performed under conditions as indicated in Table 1, the "post-coating heat treatment" column, the "atmosphere," "temperature," and "time" subcolumns. For example, for Sample 1, heat treatment was performed in a vacuum ($1 \times 10^{-3}$ Pa or less) at 850° C. for 30 minutes.

(Sample 7)

As the body of the abrasive grain, single-crystal cubic boron nitride having an average grain size of 75 μm was prepared. For sample 7, the pre-coating heat treatment was not performed, and a coating film was formed on the entire surface of the cubic boron nitride in the arc plasma powder method to obtain coated super-abrasive grains. Sample 7 was not subjected to the post-coating heat treatment.

(Sample 8)

Coated super-abrasive grains were produced in the same manner as in Sample 6, except that polycrystalline cubic boron nitride having an average grain size of 75 μm was used as the body of the abrasive grain.

(Sample 19)

As the body of the abrasive grain, single-crystal cubic boron nitride having an average grain size of 75 μm was prepared. A vacuum heat treatment furnace was used to apply the pre-coating heat treatment to the cubic boron nitride. The pre-coating heat treatment was conducted under conditions (for atmosphere, temperature and time) as indicated in Table 1, the "pre-coating heat treatment" column, the "atmosphere," "temperature," and "time" subcolumns.

After the pre-coating heat treatment, a coating film was formed on the entire surface of the cubic boron nitride in the arc plasma powder method. The coating was done with the same coating apparatus as Sample No. 1, as set under the same conditions as Sample No. 1, except for the target and the introduced gas.

The target was aluminum and titanium aluminum (50 atomic % of Ti and 50 atomic % of Al). The introduced gas was $O_2$ (oxygen) or $N_2$ (nitrogen).

Initially, a first unit layer was formed to have an average thickness of 150 nm on a surface of the body of the abrasive grain in a nitrogen atmosphere (0.88 Pa) while introducing nitrogen gas with titanium aluminum used as a target. Subsequently, a second unit layer was formed to have an average thickness of 150 nm in an oxygen atmosphere (0.88 Pa) while introducing oxygen gas with aluminum used as a target.

After the coating film was formed on the surfaces of particles of cubic boron nitride, the above vacuum heat treatment furnace was used to perform the post-coating heat treatment to obtain coated super-abrasive grains. The heat treatment was performed under conditions as indicated in Table 1, the "post-coating heat treatment" column, the "atmosphere," "temperature," and "time" subcolumns.

(Sample 24)

As the body of the abrasive grain, single-crystal cubic boron nitride having an average grain size of 75 μm was prepared. A vacuum heat treatment furnace was used to apply the pre-coating heat treatment to the cubic boron nitride. The pre-coating heat treatment was conducted under conditions (for atmosphere, temperature and time) as indicated in Table 2, the "pre-coating heat treatment" column, the "atmosphere," "temperature," and "time" subcolumns.

After the pre-coating heat treatment, a coating film was formed on the entire surface of the cubic boron nitride in the arc plasma powder method. The coating was done with the same coating apparatus as Sample No. 1, as set under the same conditions as Sample No. 1, except for the target and the introduced gas.

The target was titanium aluminum (50 atomic % of Ti and 50 atomic % of Al) and a coating film was formed in a nitrogen atmosphere (0.88 Pa). The introduced gas was $N_2$ (nitrogen).

After the coating film was formed on the surfaces of particles of cubic boron nitride, the above vacuum heat treatment furnace was used to perform the post-coating heat treatment to obtain coated super-abrasive grains. The heat treatment was performed under conditions as indicated in Table 2, the "post-coating heat treatment" column, the "atmosphere," "temperature," and "time" subcolumns.

(Sample 25)

For Sample No. 25, single-crystal cubic boron nitride having an average grain size of 75 μm was used exactly as an abrasive grain. That is, for Sample No. 25, no pre-coating heat treatment was performed, no coating film was formed and no post-coating heat treatment was performed.

(Sample 26)

For Sample 26, coated super-abrasive grains were produced under conditions similar to those for Sample 5 except that the coating film was formed in an atmosphere of argon with titanium and carbon used as a target.

(Sample 27)

For Sample 27, coated super-abrasive grains were produced under conditions similar to those for Sample 5 except that the coating film was formed in an atmosphere of nitrogen with titanium and carbon used as a target.

(Sample 28)

For Sample 28, coated super-abrasive grains were produced under conditions similar to those for Sample 5 except that the coating film was formed in an atmosphere of a gaseous mixture of nitrogen and oxygen with silicon and aluminum used as a target.

(Sample 29)

For Sample 29, coated super-abrasive grains were produced under conditions similar to those for Sample 5 except that the coating film was formed in an atmosphere of argon with titanium and boron used as a target.

(Sample 30)

For Sample 30, single-crystal cubic boron nitride having an average grain size of 75 μm was subjected to a pre-coating heat treatment similar to that applied to Sample 1 to produce abrasive grains. For Sample 30, no coating film was formed and the post-coating heat treatment was not performed.

<Measurement>

The coated super-abrasive grains and abrasive grains produced as described above were subjected to measurement to identify the dislocation density of the body of the abrasive grain (for Samples 25 and 30, the dislocation density of the abrasive grain), the coating film's composition, the atomic ratio of aluminum to oxygen in the coating film (hereinafter also referred to as an "Al/O ratio"), and the coating film's average grain size and average thickness. How they are specifically measured is the same as indicated in the first embodiment, and accordingly, it will not be described repeatedly. A result is indicated in Tables 1 and 2, a "body of abrasive grain/abrasive grain" column, the "dislocation density" subcolumn, and the "coating film" column, the "composition," "Al/O ratio," "average grain size" and "average thickness" subcolumns.

<Fabricating a Wheel>

The coated super-abrasive grains or abrasive grains produced as described above were used to produce wheels having the same configuration as that of wheel 10 shown in FIGS. 3 to 5. More specifically, a plurality of super-abrasive grains were fixed to an outer peripheral surface of a substrate with a bonding material to produce each wheel. The substrate was made of S45C, and had a diameter (an outer diameter): 50 mm, a mounting hole diameter (an inner diameter): 20 mm, and a thickness: 8 mm. The bonding material was an Ag wax material.

<Evaluation of Grinding Performance>

The wheel of each sample had its grinding performance evaluated by determining its grinding ratio. The grinding ratio was determined as follows: the wheel of each sample was set in the following apparatus and ground a workpiece for 180 minutes under the following conditions, and the grinding ratio was determined from "the volume of the workpiece ground away/the total worn volume of super-abrasive grains." That is, the higher the grinding ratio, the better the grinding performance. A result thereof is shown in tables 1 and 2.

Workpiece: SCM 415 hardened steel (3.5 mm×60 mm×100 mm)
Apparatus: Machining Center V-55 produced by Makino Milling Machine Co., Ltd.
Grinding wheel's peripheral speed: 2700 mm/min
Cutting: 0.17 mm
Feed rate: 150 mm/min
Coolant: Emulsion type (YUSHIROKEN (registered trademark))

TABLE 1

| | body of abrasive grain/abrasive grain | | | pre-coating heat treatment | | | condition for atmosphere | |
|---|---|---|---|---|---|---|---|---|
| samples | composition | structure | average grain size (μm) | atmosphere | temperature (° C.) | time (hrs) | when forming coating film (type: Pa) | post-coating heat treatment atmpsphere |
| 1 | cBN | single crystal | 75 | vacuum | 900 | 0.5 | $O_2$: 0.88 | vacuum |
| 2 | cBN | single crystal | 75 | vacuum | 900 | 1 | $O_2$: 0.88 | vacuum |
| 3 | cBN | single crystal | 75 | vacuum | 900 | 1.3 | $O_2$: 0.83 | vacuum |
| 4 | cBN | single crystal | 75 | vacuum | 900 | 2 | $O_2$: 0.38 | vacuum |
| 5 | cBN | single crystal | 75 | vacuum | 950 | 2.5 | $O_2$: 0.88 | vacuum |
| 6 | cBN | single crystal | 75 | vacuum | 950 | 3 | $O_2$: 0.83 | vacuum |
| 7 | cBN | single crystal | 75 | — | — | — | $O_2$: 0.38 | — |
| 8 | cBN | polycrystalline | 75 | vacuum | 950 | 3 | $O_2$: 0.88 | vacuum |
| 9 | cBN | single crystal | 75 | vacuum | 1000 | 3 | $O_2$: 0.83 | vacuum |
| 10 | cBN | single crystal | 75 | vacuum | 1350 | 3 | $O_2$: 0.38 | vacuum |
| 11 | cBN | single crystal | 75 | vacuum | 950 | 3 | $O_2$: 0.78 | vacuum |
| 12 | cBN | single crystal | 75 | vacuum | 950 | 3 | $O_2$: 0.93 | vacuum |
| 13 | cBN | single crystal | 75 | vacuum | 950 | 3 | $O_2$: 0.65 | vacuum |
| 14 | cBN | single crystal | 75 | vacuum | 950 | 3 | $O_2$: 1 | vacuum |
| 15 | cBN | single crystal | 75 | vacuum | 950 | 3 | $O_2$: 0.55 | vacuum |
| 16 | cBN | single crystal | 75 | vacuum | 950 | 3 | $O_2$: 0.88 | vacuum |
| 17 | cBN | single crystal | 75 | vacuum | 950 | 3 | $O_2$: 0.88 | vacuum |
| 18 | cBN | single crystal | 75 | vacuum | 950 | 3 | $O_2$: 0.88 | vacuum |
| 19 | cBN | single crystal | 75 | vacuum | 950 | 3 | $N_2$: 0.88 → $O_2$: 0.88 | vacuum |
| 20 | cBN | single crystal | 30 | vacuum | 950 | 3 | $O_2$: 0.88 | vacuum |
| 21 | cBN | single crystal | 600 | vacuum | 950 | 3 | $O_2$: 0.88 | vacuum |
| 22 | cBN | single crystal | 20 | vacuum | 950 | 3 | $O_2$: 0.88 | vacuum |
| 23 | cBN | single crystal | 800 | vacuum | 950 | 3 | $O_2$: 0.88 | vacuum |

| | post-coating heat treatment | | body of abrasive grain/abrasive grain | | coating film | | | |
|---|---|---|---|---|---|---|---|---|
| samples | temperature (° C.) | time (min.) | dislocation density (/m$^2$) | composition | Al/O ratio | average grain size (nm) | average thickness (nm) | grinding ratio |
| 1 | 850 | 30 | $9.00 \times 10^{14}$ | γ-$Al_2O_3$ | 0.7 | 50 | 300 | 3000 |
| 2 | 850 | 30 | $3.00 \times 10^{14}$ | γ-$Al_2O_3$ | 0.7 | 50 | 300 | 3060 |
| 3 | 850 | 30 | $2.00 \times 10^{14}$ | γ-$Al_2O_3$ | 0.7 | 50 | 300 | 3100 |
| 4 | 850 | 30 | $7.00 \times 10^{13}$ | γ-$Al_2O_3$ | 0.7 | 50 | 300 | 3150 |
| 5 | 850 | 30 | $5.00 \times 10^{13}$ | γ-$Al_2O_3$ | 0.7 | 50 | 300 | 3400 |
| 6 | 850 | 30 | $1.00 \times 10^{13}$ | γ-$Al_2O_3$ | 0.7 | 50 | 300 | 3500 |
| 7 | — | — | $3.00 \times 10^{15}$ | γ-$Al_2O_3$ | 0.7 | 50 | 300 | 1600 |
| 8 | 850 | 30 | $1.00 \times 10^{13}$ | γ-$Al_2O_3$ | 0.7 | 50 | 300 | 3400 |
| 9 | 950 | 30 | $8.00 \times 10^{12}$ | γ-$Al_2O_3$ | 0.7 | 450 | 300 | 3120 |

TABLE 1-continued

| | | | | | | | | |
|---|---|---|---|---|---|---|---|---|
| 10 | 1300 | 30 | $6.00 \times 10^{12}$ | $\alpha$-$Al_2O_3$ | 0.7 | 50 | 300 | 3450 |
| 11 | 950 | 30 | $1.00 \times 10^{13}$ | $\gamma$-$Al_2O_3$ | 0.5 | 50 | 300 | 3460 |
| 12 | 950 | 30 | $1.00 \times 10^{13}$ | $\gamma$-$Al_2O_3$ | 0.85 | 50 | 300 | 2980 |
| 13 | 950 | 30 | $1.00 \times 10^{13}$ | $\gamma$-$Al_2O_3$ | 0.25 | 50 | 300 | 2970 |
| 14 | 950 | 30 | $1.00 \times 10^{13}$ | $\gamma$-$Al_2O_3$ | 1 | 50 | 300 | 2940 |
| 15 | 950 | 30 | $1.00 \times 10^{13}$ | $\gamma$-$Al_2O_3$ | 0.15 | 50 | 300 | 2930 |
| 16 | 850 | 30 | $1.00 \times 10^{13}$ | $\gamma$-$Al_2O_3$ | 0.7 | 50 | 30 | 2800 |
| 17 | 850 | 30 | $1.00 \times 10^{13}$ | $\gamma$-$Al_2O_3$ | 0.7 | 50 | 800 | 2310 |
| 18 | 850 | 30 | $1.00 \times 10^{13}$ | $\gamma$-$Al_2O_3$ | 0.7 | 50 | 1200 | 2790 |
| 19 | 850 | 30 | $1.00 \times 10^{13}$ | TiAlN (1st layer) $\gamma$-$Al_2O_3$ (2nd layer) | 0.7 | 1st layer: 50 2nd layer: 50 | 1st layer + 2nd layer: 300 | 3300 |
| 20 | 850 | 30 | $1.00 \times 10^{13}$ | $\gamma$-$Al_2O_3$ | 0.7 | 50 | 300 | 2700 |
| 21 | 850 | 30 | $1.00 \times 10^{13}$ | $\gamma$-$Al_2O_3$ | 0.7 | 50 | 300 | 2710 |
| 22 | 850 | 30 | $1.00 \times 10^{13}$ | $\gamma$-$Al_2O_3$ | 0.7 | 50 | 300 | 2630 |
| 23 | 850 | 30 | $1.00 \times 10^{13}$ | $\gamma$-$Al_2O_3$ | 0.7 | 50 | 300 | 2670 |

TABLE 2

| | body of abrasive grain/abrasive grain | | | pre-coating heat treatment | | | condition for atmosphere when forming coating film (type: Pa) | post-coating heat treatment atmosphere |
|---|---|---|---|---|---|---|---|---|
| samples | composition | structure | average grain size (μm) | atmosphere | temperature (° C.) | time (hrs) | | |
| 24 | cBN | single crystal | 75 | vacuum | 950 | 3 | $N_2$: 0.88 | vacuum |
| 25 | cBN | single crystal | 75 | — | — | — | — | — |
| 26 | cBN | single crystal | 75 | vacuum | 950 | 2.5 | $O_2$: 0.88 | vacuum |
| 27 | cBN | single crystal | 75 | vacuum | 950 | 2.5 | $O_2$: 0.88 | vacuum |
| 28 | cBN | single crystal | 75 | vacuum | 950 | 2.5 | $O_2$: 0.88 | vacuum |
| 29 | cBN | single crystal | 75 | vacuum | 950 | 2.5 | $O_2$: 0.88 | vacuum |
| 30 | cBN | single crystal | 75 | vacuum | 900 | 0.5 | — | — |

| | body of abrasive grain/abrasive post-coating heat treatment | | grain dislocation density (/m²) | coating film | | | | |
|---|---|---|---|---|---|---|---|---|
| samples | temperature (° C.) | time (min.) | | composition | Al/O ratio | average grain size (nm) | average thickness (nm) | grinding ratio |
| 24 | 850 | 30 | $1.00 \times 10^{13}$ | TiAlN | 0.7 | 50 | 300 | 3000 |
| 25 | — | — | $5.00 \times 10^{15}$ | no coating film | | | | 1000 |
| 26 | 850 | 30 | $5.00 \times 10^{15}$ | TiC | — | 50 | 300 | 2800 |
| 27 | 850 | 30 | $5.00 \times 10^{13}$ | TiCN | — | 50 | 300 | 2850 |
| 28 | 850 | 30 | $5.00 \times 10^{13}$ | SiAlON | — | 50 | 300 | 2780 |
| 29 | 850 | 30 | $5.00 \times 10^{13}$ | $TiB_2$ | — | 50 | 300 | 2170 |
| 30 | — | — | $9.00 \times 10^{14}$ | no coating film | | | | 2143 |

<Evaluation>

The coated super-abrasive grains of Sample 1 to Sample 6, Sample 8 to Sample 24, Sample 26 to Sample 29, and the abrasive grain of Sample 30 correspond to Examples. The coated super-abrasive grain of Sample 7 has a body with a dislocation density exceeding $9 \times 10^{14}$, and thus corresponds to a comparative example. The abrasive grain of Sample 25 has a dislocation density exceeding $9 \times 10^{14}$, and thus corresponds to a comparative example.

It has been confirmed that the wheels of Sample 1 to Sample 6, Sample 8 to Sample 24, and Sample 26 to Sample 30 all have a grinding ratio higher than those of the wheels of Sample 7 and Sample 25.

Example 2

<Sample 2-1 to Sample 2-6>

For Samples 2-1 to 2-5, single-crystal cubic boron nitride having an average grain size of 75 μm was exposed to an electron beam to produce abrasive grains. For Sample 2-6, polycrystalline cubic boron nitride having an average grain size of 75 μm was exposed to an electron beam to produce abrasive grains. The electron beam was provided under conditions indicated in Table 3, the "condition for exposure to electron beam" column, the "exposure energy" and "exposure time" subcolumns.

(Sample 2-7)

Single-crystal cubic boron nitride having an average grain size of 75 μm was prepared, and a vacuum heat treatment furnace ("NRF-658-0.7D1.5V" produced by Nihon-tokusyukikai) was used to apply heat treatment as a pre-coating treatment to the cubic boron nitride. The heat treatment was performed in a vacuum at 900° C. for 0.7 hour.

After the pre-coating heat treatment, a coating film was formed on the entire surface of the cubic boron nitride in the arc plasma powder method. The coating was done with the same coating apparatus as Sample No. 1, as set under the same condition as Sample No. 1 (see Table 3, the "condition for atmosphere when forming the coating film" column.

After the coating film was formed on the surfaces of particles of cubic boron nitride, the same vacuum heat treatment furnace as Example 1 was used to perform the post-coating heat treatment to obtain coated super-abrasive grains for Sample 2-7. The heat treatment was done under the same conditions as Sample No. 1 (see Table 3, the "post-coating heat treatment" column, the "temperature" and "time" subcolumns.

(Sample 2-8)

Single-crystal cubic boron nitride having an average grain size of 75 μm was prepared, and a coating film was formed on the entire surface of the cubic boron nitride in the arc plasma powder method. The coating was done with the same coating apparatus as Sample No. 1, as set under the same condition as Sample No. 1 (see Table 3, the "condition for atmosphere when forming the coating film" column.

After the coating film was formed on the surfaces of particles of cubic boron nitride, the same vacuum heat treatment furnace as Example 1 was used to perform the post-coating heat treatment to obtain coated super-abrasive grains for Sample 2-8. The heat treatment was done under the same conditions as Sample No. 1 (see Table 3, the "post-coating heat treatment" column, the "temperature" and "time" subcolumns.

(Sample 2-9)

Single-crystal cubic boron nitride having an average grain size of 75 μm was prepared, and a coating film was formed on the entire surface of the cubic boron nitride in the arc plasma powder method to obtain coated super-abrasive grains for Sample 2-9. The coating was done with the same coating apparatus as Sample No. 1, as set under the same condition as Sample No. 1 (see Table 3, the "condition for atmosphere when forming the coating film" column.

(Sample 2-10)

For Sample No. 2-10, single-crystal cubic boron nitride having an average grain size of 75 μm was used to serve as an abrasive grain.

(Sample 2-11)

Single-crystal cubic boron nitride having an average grain size of 75 μm was exposed to an electron beam. The electron beam was provided under conditions indicated in Table 3, the "condition for exposure to electron beam" column, the "exposure energy" and "exposure time" subcolumns.

After the cubic boron nitride was exposed to the electron beam, a vacuum heat treatment furnace ("NRF-658-0.7D1.5V" produced by Nihon-tokusyukikai) was used to apply heat treatment as a pre-coating treatment to the cubic boron nitride. The heat treatment was performed in a vacuum at 900° C., for 0.7 hour.

After the pre-coating heat treatment, a coating film was formed on the entire surface of the cubic boron nitride in the arc plasma powder method. The coating was done with the same coating apparatus as Sample No. 1, as set under the same condition as Sample No. 1 (see Table 3, the "condition for atmosphere when forming the coating film" column.

After the coating film was formed on the surfaces of particles of cubic boron nitride, the same vacuum heat treatment furnace as Example 1 was used to perform the post-coating heat treatment to obtain coated super-abrasive grains for Sample 2-11. The heat treatment was done under the same conditions as Sample No. 1 (see Table 3, the "post-coating heat treatment" column, the "temperature" and "time" subcolumns.

<Measurement>

The coated super-abrasive grains and abrasive grains produced as described above were subjected to measurement to identify the dislocation density of the body of the abrasive grain (for Samples 2-1 to 2-6 and Sample 2-10, the dislocation density of the abrasive grain), the coating film's composition, the atomic ratio of aluminum to oxygen in the coating film (hereinafter also referred to as an "Al/O ratio"), and the coating film's average grain size and average thickness. How they are specifically measured is the same as indicated in the first embodiment, and accordingly, it will not be described repeatedly. A result is indicated in Table 3, a "body of abrasive grain/abrasive grain" column, the "dislocation density" subcolumn, and the "coating film" column, the "composition," "Al/O ratio," "average grain size" and "average thickness" subcolumns.

<Producing a Wheel>

The coated super-abrasive grains or abrasive grains produced as described above were used in a method similar to that in Example 1 to produce wheels having the same shape as that of Example 1.

<Evaluation of Grinding Performance>

The wheel of each sample had its grinding performance evaluated by determining its grinding ratio. The grinding ratio was determined as follows: the wheel of each sample was set in the following apparatus and ground a workpiece for 180 minutes under the following conditions, and the grinding ratio was determined from "the volume of the workpiece ground away/the total worn volume of super-abrasive grains." That is, the higher the grinding ratio, the better the grinding performance. A result is shown in Table 3.

Workpiece: SCM 415 hardened steel (3.5 mm×60 mm+100 mm)

Apparatus: Machining Center V-55 produced by Makino Milling Machine Co., Ltd.

Grinding wheel's peripheral speed: 2700 mm/min

Cutting: 0.5 mm

Feed rate: 100 mm/min

Coolant: Emulsion type (YUSHIROKEN (registered trademark))

TABLE 3

| samples | body of abrasive grain/abrasive grain | | average grain size (μm) | condition for exposure to electron beam | | pre-coating heat treatment | | condition for atmosphere when forming coating film (type: Pa) |
|---|---|---|---|---|---|---|---|---|
| | composition | structure | | exposure energy (MeV) | exposure time (hrs) | temperature (° C.) | time (hrs) | |
| 2-1 | cBN | single crystal | 75 | 25 | 13 | — | — | — |
| 2-2 | cBN | single crystal | 75 | 30 | 5 | — | — | — |
| 2-3 | cBN | single crystal | 75 | 30 | 10 | — | — | — |
| 2-4 | cBN | single crystal | 75 | 30 | 15 | — | — | — |
| 2-5 | cBN | single crystal | 75 | 30 | 24 | — | — | — |
| 2-6 | cBN | poly-crystalline | 75 | 30 | 10 | — | — | — |
| 2-7 | cBN | single crystal | 75 | — | — | 900 | 0.7 | $O_2$: 0.83 |
| 2-8 | cBN | single crystal | 75 | — | — | — | — | $O_2$: 0.88 |
| 2-9 | cBN | single crystal | 75 | — | — | — | — | $O_2$: 0.88 |
| 2-10 | cBN | single crystal | 75 | — | — | — | — | — |
| 2-11 | cBN | single crystal | 75 | 30 | 24 | 900 | 0.7 | $O_2$: 0.88 |

| samples | post-coating heat treatment | | body of abrasive grain/abrasive grain dislocation density (/m$^2$) | coating film | | | | grinding ratio |
|---|---|---|---|---|---|---|---|---|
| | temperature (° C.) | time (hrs) | | composition | Al/O ratio | average grain size (nm) | average thickness (nm) | |
| 2-1 | — | — | $6.0 \times 10^{14}$ | no coating film | | | | 2300 |
| 2-2 | — | — | $3.0 \times 10^{11}$ | no coating film | | | | 2320 |
| 2-3 | — | — | $2.0 \times 10^{14}$ | no coating film | | | | 2350 |
| 2-4 | — | — | $6.0 \times 10^{13}$ | no coating film | | | | 2370 |
| 2-5 | — | — | $5.0 \times 10^{13}$ | no coating film | | | | 2400 |
| 2-6 | — | — | $5.0 \times 10^{14}$ | no coating film | | | | 2320 |
| 2-7 | 850 | 30 | $6.2 \times 10^{11}$ | γ-$Al_2O_3$ | 0.7 | 50 | 300 | 2280 |
| 2-8 | 850 | 30 | $6.5 \times 10^{14}$ | γ-$Al_2O_3$ | 0.7 | 50 | 300 | 2250 |
| 2-9 | — | — | $1.0 \times 10^{15}$ | γ-$Al_2O_3$ | 0.7 | 50 | 300 | 1100 |
| 2-10 | — | — | $5.0 \times 10^{15}$ | no coating film | | | | 700 |
| 2-11 | 850 | 30 | $1.0 \times 10^{13}$ | γ-$Al_2O_3$ | 0.7 | 50 | 300 | 3000 |

<Evaluation>

The abrasive grains and coated super-abrasive grains of Samples 2-1 to 2-8 and Sample 2-11 correspond to Examples. The coated super-abrasive grain of Sample 2-9 has a body with a dislocation density exceeding $9 \times 10^{14}$, and thus corresponds to a comparative example. The abrasive grain of Sample 2-10 has a dislocation density exceeding $9 \times 10^{14}$, and thus corresponds to a comparative example.

It has been confirmed that the wheels of Sample 2-1 to Sample 2-8 and Sample 2-11 all have a grinding ratio higher than those of the wheels of Sample 2-9 and Sample 2-10.

When Samples 2-1 to 2-6 and Sample 2-10 were compared, it has been confirmed that dislocation density decreases when cubic boron nitride is exposed to an electron beam.

When Sample 2-9 and Sample 2-10 were compared, it has been confirmed that the coated super-abrasive grain having the coating film (Sample 2-9) has a body with a lower dislocation density than the abrasive grain alone (Sample 2-10) and obtains a grinding ratio of about 1.5 times that of the abrasive grain alone (Sample 2-10). Although why the body of the abrasive grain of Sample 2-9 has a low dislocation density is not clarified, there is a possibility that, in coating the body, the abrasive grain has a surface exposed to Al and oxygen ions of the atomic level and may thus have lattice defects alleviated in a vicinity of the surface, a possibility that the abrasive grain may per se vary in dislocation, or the like.

When Sample 2-8 and Sample 2-9 were compared, it has been confirmed that Sample 2-8 subjected to the post-coating heat treatment had a grinding ratio of about twice that of Sample 2-9 without the post-coating heat treatment. Although the reason for this is unknown, it is inferred that, in Sample 2-8, particles of the molecular level radiated in forming the coating film diffuse in the post-coating heat treatment and thus reduce defects in the vicinity of the surface of the coated abrasive grain.

When Sample 2-7, Sample 2-8, and Sample 2-9 were compared, it has been confirmed that exposure to an electron beam and/or application of heat treatment further reduce/reduces the dislocation density of the body of the abrasive grain and improve/improves the grinding ratio.

Example 3

<Sample 3-1>

For Sample No. 3-1, single-crystal cubic boron nitride having an average grain size of 75 μm was used to serve as an abrasive grain.

<Sample 3-2>

Single-crystal cubic boron nitride having an average grain size of 75 μm was exposed to an electron beam to produce abrasive grains for Sample 3-2. The electron beam was provided under conditions indicated in Table 4, the "condition for exposure to electron beam" column, the "exposure energy" and "exposure time" subcolumns.

<Sample 3-3 to Sample 3-10>

Single-crystal cubic boron nitride having an average grain size of 75 μm was exposed to an electron beam. The electron beam was provided under conditions indicated in Table 4, the "condition for exposure to electron beam" column, the "exposure energy" and "exposure time" subcolumns.

After the cubic boron nitride was exposed to the electron beam, a vacuum heat treatment furnace ("NRF-658-0.7D1.5V" produced by Nihon-tokusyukikai) was used to apply heat treatment to obtain abrasive grains for Sample 3-3 to Sample 3-10. The heat treatment was performed in a vacuum at a temperature for a period of time, as indicated in Table 4, the "(pre-coating) heat treatment" column, the "temperature" and "time" subcolumns. For example, for Sample No. 3-3, the heat treatment was performed in a vacuum at 900° C. for 1 hour.

<Sample 3-11 to Sample 3-13>

Single-crystal cubic boron nitride having an average grain size of 75 μm was exposed to an electron beam. The electron beam was provided under conditions indicated in Table 4, the "condition for exposure to electron beam" column, the "exposure energy" and "exposure time" subcolumns.

After the cubic boron nitride was exposed to the electron beam, a vacuum heat treatment furnace ("NRF-658-0.7D1.5V" produced by Nihon-tokusyukikai) was used to apply the pre-coating heat treatment. The heat treatment was performed in a vacuum at a temperature for a period of time, as indicated in Table 4, the "(pre-coating) heat treatment" column, the "temperature" and "time" subcolumns. For example, for Sample No. 3-11, the heat treatment was performed in a vacuum at 950° C. for 3.5 hours.

After the pre-coating heat treatment, a coating film was formed on the entire surface of the cubic boron nitride in the arc plasma powder method to obtain coated super-abrasive grains for Samples 3-11 to 3-13. The coating was done with the same coating apparatus as Sample No. 1, as set under the same condition as Sample No. 1 (see Table 4, the "condition for atmosphere when forming the coating film" column).

<Measurement>

The coated super-abrasive grains and abrasive grains produced as described above were subjected to measurement to identify the body's crystallite size and dislocation density (for Samples 3-1 to 3-10, the abrasive grain's crystallite size and dislocation density), the coating film's composition, the atomic ratio of aluminum to oxygen in the coating film (hereinafter also referred to as an "Al/O ratio"), and the coating film's average grain size and average thickness. How they are specifically measured is the same as indicated in the first embodiment, and accordingly, it will not be described repeatedly. A result is indicated in Table 4, a "body of abrasive grain/abrasive grain" column, the "crystallite size" and "dislocation density" subcolumns, and the "coating film" column, the "composition," "Al/O ratio," "average grain size" and "average thickness" subcolumns.

<Producing a Wheel>

The coated super-abrasive grains or abrasive grains produced as described above were used in a method similar to that in Example 1 to produce wheels having the same shape as that of Example 1.

<Evaluation of Grinding Performance>

The wheel of each sample had its grinding performance evaluated by determining its grinding ratio. The grinding ratio was determined as follows: the wheel of each sample was set in the following apparatus and ground a workpiece for 180 minutes under the following conditions, and the grinding ratio was determined from "the volume of the workpiece ground away/the total worn volume of super-abrasive grains," That is, the higher the grinding ratio, the better the grinding performance. A result thereof is shown in Table 4.

Workpiece: SCM 415 hardened steel (3.5 mm×60 mm×100 mm)

Apparatus: Machining Center V-55 produced by Makino Milling Machine Co., Ltd.

Grinding wheel's peripheral speed: 2700 mm/min

Cutting: 1.0 mm

Feed rate: 100 mm/min

Coolant: Emulsion type (YUSHIROKEN (registered trademark))

TABLE 4

| | body of abrasive grain/abrasive grain | | | condition for exposure to electron beam | | (pre-coating) heat treatment | | condition for atmosphere when forming coating film |
| --- | --- | --- | --- | --- | --- | --- | --- | --- |
| samples | composition | structure | average grain size (μm) | exposure energy (MeV) | exposure time (hrs) | temperature (° C.) | time (hrs) | (type: Pa) |
| 3-1 | cBN | single crystal | 75 | — | — | — | — | — |
| 3-2 | cBN | single crystal | 75 | 25 | 13 | — | — | — |
| 3-3 | cBN | single crystal | 75 | 25 | 13 | 900 | 1 | — |

TABLE 4-continued

| | | | | | | | | |
|---|---|---|---|---|---|---|---|---|
| 3-4 | cBN | single crystal | 75 | 25 | 14 | 900 | 2 | — |
| 3-5 | cBN | single crystal | 75 | 25 | 15 | 950 | 2 | — |
| 3-6 | cBN | single crystal | 75 | 25 | 16 | 950 | 3 | — |
| 3-7 | cBN | single crystal | 75 | 30 | 5 | 950 | 3.5 | — |
| 3-8 | cBN | single crystal | 75 | 30 | 8 | 950 | 6 | — |
| 3-9 | cBN | single crystal | 75 | 30 | 5 | 900 | 1.5 | — |
| 3-10 | cBN | single crystal | 75 | 25 | 14 | 950 | 3 | — |
| 3-11 | cBN | single crystal | 75 | 30 | 5 | 950 | 3.5 | $O_2$: 0.88 |
| 3-12 | cBN | single crystal | 75 | 25 | 16 | 950 | 3 | $O_2$: 0.88 |
| 3-13 | cBN | single crystal | 75 | 25 | 14 | 900 | 2 | $O_2$: 0.88 |

| | body of abrasive grain/abrasive grain | | coating film | | | | |
|---|---|---|---|---|---|---|---|
| samples | crystallite size (nm) | dislocation density (/m$^2$) | composition | Al/O ratio | average grain size (nm) | average thickness (nm) | grinding ratio |
| 3-1 | 200 | $5.0 \times 10^{15}$ | no coating film | | | | 1500 |
| 3-2 | 230 | $6.0 \times 10^{14}$ | no coating film | | | | 4000 |
| 3-3 | 260 | $8.0 \times 10^{14}$ | no coating film | | | | 5000 |
| 3-4 | 400 | $7.5 \times 10^{14}$ | no coating film | | | | 5200 |
| 3-5 | 450 | $7.0 \times 10^{14}$ | no coating film | | | | 5500 |
| 3-6 | 550 | $6.5 \times 10^{14}$ | no coating film | | | | 5700 |
| 3-7 | 600 | $2.0 \times 10^{14}$ | no coating film | | | | 6000 |
| 3-8 | 1000 | $5.0 \times 10^{13}$ | no coating film | | | | 6200 |
| 3-9 | 300 | $3.0 \times 10^{14}$ | no coating film | | | | 5900 |
| 3-10 | 600 | $7.0 \times 10^{14}$ | no coating film | | | | 5800 |
| 3-11 | 600 | $2.0 \times 10^{14}$ | γ-Al$_2$O$_3$ | 0.7 | 50 | 300 | 9000 |
| 3-12 | 550 | $6.5 \times 10^{14}$ | γ-Al$_2$O$_3$ | 0.7 | 50 | 300 | 8700 |
| 3-13 | 400 | $7.5 \times 10^{14}$ | γ-Al$_2$O$_3$ | 0.7 | 50 | 300 | 8000 |

<Evaluation>

The abrasive grains and coated super-abrasive grains of Samples 3-2 to Sample 3-13 correspond to Examples. The coated super-abrasive grain of Sample 3-1 has a body with a dislocation density exceeding $9 \times 10^{14}$, and thus corresponds to a comparative example.

It has been confirmed that the wheels of Sample 3-2 to Sample 3-13 all have a grinding ratio higher than that of the wheel of Sample 3-1.

From a result of Example 3, it has been confirmed that cubic boron nitride constituting the abrasive grain (or the body of the abrasive grain) can be varied in dislocation density and crystallite size through exposure to an electron beam and a wheel with higher performance can be obtained.

While embodiments and examples of the present disclosure have been described as above, it is also planned from the beginning that the configurations of the above-described embodiments and examples are appropriately combined and variously modified.

The presently disclosed embodiments and examples are illustrative in any respects and should not be construed as being restrictive. The scope of the present invention is defined by the scope of the claims, rather than the embodiments and the examples described above, and is intended to include any modifications within the scope and meaning equivalent to the scope of the claims.

REFERENCE SIGNS LIST

1 coated super-abrasive grain, 2 body of abrasive grain, 3 coating film, 31 first unit layer, 32 second unit layer, 33 third unit layer, 10 wheel, 11 substrate, 111 outer peripheral surface, 12 super-abrasive grain layer, 13 bonding material.

The invention claimed is:

1. A coated super-abrasive grain comprising:
  a body composed of cubic boron nitride; and
  a coating film coating at least a portion of a surface of the body,
  the body having a dislocation density of $9 \times 10^{14}$/m$^2$ or less,
  the coating film including one or more types of compounds composed of at least one type of element selected from the group consisting of a group 4 element, a group 5 element and a group 6 element of the periodic table, aluminum and silicon, and at least one type of element selected from the group consisting of oxygen, nitrogen, carbon, and boron.

2. The coated super-abrasive grain according to claim 1, wherein the body has a single-crystal structure.

3. The coated super-abrasive grain according to claim 1, wherein the body has a polycrystalline structure.

4. The coated super-abrasive grain according to claim 1, wherein the body has a dislocation density of $2 \times 10^{14}$/m$^2$ or less.

5. The coated super-abrasive grain according to claim 1, wherein the coating film includes aluminum and oxygen.

6. The coated super-abrasive grain according to claim 1, wherein the coating film includes γ-Al$_2$O$_3$.

7. The coated super-abrasive grain according to claim 1, wherein the coating film includes a plurality of crystal grains, and
the plurality of crystal grains have an average grain size of 500 nm or less.

8. The coated super-abrasive grain according to claim 1, wherein in the coating film, aluminum and oxygen have an atomic ratio Al/O of 0.2 or more and 0.9 or less.

9. The coated super-abrasive grain according to claim 1, wherein the coating film has a thickness of 50 nm or more and 1000 nm or less.

10. The coated super-abrasive grain according to claim 1, wherein the coating film has a multilayer structure composed of two or more types of unit layers.

11. The coated super-abrasive grain according to claim 1, having a grain size of 30 μm or more and 600 μm or less.

12. An abrasive grain composed of cubic boron nitride and having a dislocation density of $9 \times 10^{14}/m^2$ or less.

13. The abrasive grain according to claim 12, having a single-crystal structure.

14. The abrasive grain according to claim 12, having a polycrystalline structure.

15. The abrasive grain according to claim 12, wherein the dislocation density is $6.5 \times 10^{14}/m^2$ or less.

16. The abrasive grain according to claim 12, wherein the dislocation density is $2 \times 10^{14}/m^2$ or less.

17. The abrasive grain according to claim 12, composed of crystallites having a size of 250 nm or more.

18. The abrasive grain according to claim 17, wherein the crystallite has a size of 450 nm or more.

19. The abrasive grain according to claim 12, having a grain size of 30 μm or more and 600 μm or less.

20. A wheel comprising:
a disk-shaped substrate; and
a super-abrasive grain layer covering at least an outer peripheral surface of the substrate,
the super-abrasive grain layer having the coated super-abrasive grain according to claim 1.

* * * * *